(12) United States Patent
Reynolds et al.

(10) Patent No.: US 7,924,029 B2
(45) Date of Patent: Apr. 12, 2011

(54) HALF-BRIDGE FOR CAPACITIVE SENSING

(75) Inventors: Joseph Kurth Reynolds, Sunnyvale, CA (US); Kirk Hargreaves, Mountain View, CA (US)

(73) Assignee: Synaptics Incorporated, Santa Clara, CA (US)

( * ) Notice: Subject to any disclaimer, the term of this patent is extended or adjusted under 35 U.S.C. 154(b) by 52 days.

(21) Appl. No.: 11/615,408

(22) Filed: Dec. 22, 2006

(65) Prior Publication Data
US 2007/0159184 A1    Jul. 12, 2007

Related U.S. Application Data

(60) Provisional application No. 60/753,501, filed on Dec. 22, 2005.

(51) Int. Cl.
*G01R 27/26* (2006.01)
(52) U.S. Cl. .......... 324/672; 324/678; 324/679
(58) Field of Classification Search .......... 324/679, 324/680, 662, 424; 340/870
See application file for complete search history.

(56) References Cited

U.S. PATENT DOCUMENTS

| | | | |
|---|---|---|---|
| 4,168,464 A | | 9/1979 | Coulson et al. |
| 4,459,541 A | | 7/1984 | Fielden et al. |
| 4,918,454 A | | 4/1990 | Early et al. |
| 5,038,142 A | | 8/1991 | Flowers et al. |
| 5,801,340 A | * | 9/1998 | Peter ......................... 178/20.04 |
| 6,014,022 A | * | 1/2000 | Demma et al. ............ 324/207.12 |
| 6,225,710 B1 | * | 5/2001 | Palata et al. .................... 307/109 |
| 6,466,036 B1 | | 10/2002 | Philipp |
| 6,703,845 B2 | * | 3/2004 | Stanley et al. ................ 324/663 |
| 6,724,324 B1 | * | 4/2004 | Lambert ......................... 341/33 |
| 6,839,247 B1 | * | 1/2005 | Yang et al. ................ 363/21.11 |
| 7,382,360 B2 | * | 6/2008 | Mackey et al. ............... 345/173 |

(Continued)

FOREIGN PATENT DOCUMENTS

DE    3933552    4/1990

(Continued)

OTHER PUBLICATIONS

Agilent 33220A 20 MHz Function/Arbitrary Waveform Generator, Data Sheet, Agilent Technologies, Inc., Copyright Agilent Technologies, Inc, 2006, Printed Apr. 19, 2006.*

(Continued)

*Primary Examiner* — Timothy J Dole
*Assistant Examiner* — Benjamin M Baldridge
(74) *Attorney, Agent, or Firm* — Ingrassia Fisher & Lorenz, P.C.

(57) ABSTRACT

Methods and apparatus are provided for measuring a ratio of capacitances. The apparatus include a comparator including a comparator input, a comparator output, and a reference voltage; a first capacitive element including a first capacitance, a first electrode coupled to the comparator input, and a second electrode; a first biasing element coupled to the first electrode; a digitally-controlled voltage waveform generator for generating a varying waveform, the voltage waveform generator including a voltage waveform generator output coupled to the second electrode; a second capacitive element including a second capacitance and a third electrode coupled to the comparator input; and a controller coupled to the comparator output, the controller configured to control the digitally-controlled voltage waveform generator, wherein an output signal of the comparator is dependent on a ratio comprising the first capacitance and the second capacitance, and the first capacitive element and/or the second capacitive element has a variable capacitance.

31 Claims, 17 Drawing Sheets

U.S. PATENT DOCUMENTS

| | | | |
|---|---|---|---|
| 2001/0045733 A1* | 11/2001 | Stanley et al. | 280/735 |
| 2002/0015023 A1 | 2/2002 | Watanabe et al. | |
| 2002/0030666 A1* | 3/2002 | Philipp | 345/168 |
| 2003/0091220 A1* | 5/2003 | Sato et al. | 382/124 |
| 2003/0184533 A1* | 10/2003 | Roh et al. | 345/204 |
| 2004/0113634 A1* | 6/2004 | Stanley et al. | 324/661 |
| 2005/0016273 A1* | 1/2005 | Murata et al. | 73/514.32 |
| 2005/0184799 A1* | 8/2005 | Kii | 327/545 |
| 2005/0218913 A1* | 10/2005 | Inaba et al. | 324/678 |
| 2009/0115431 A1* | 5/2009 | Philipp | 324/686 |

FOREIGN PATENT DOCUMENTS

| | | |
|---|---|---|
| JP | 6507723 T | 9/1994 |

OTHER PUBLICATIONS

Agilent 33220A, 20 MHz Function/Arbitrary Waveform Generator Data Sheet, Copyright Agilent Technologies, Inc., 2003, 2004, Printed May 1, 2004 5988-8544EN.*

Agilent 33220A 20 MHz Function/Arbitrary Waveform Generator, Data Sheet, Agilent Technologies, Inc., Copyright Agilent Technologies, Inc, 2006, Printed Apr. 19, 2006 (Furnished with a previous Office Action).*

Huang, S.M. et al., "Electronic Transducers for Industrial Measurement of Low Value Capacitances", J. Phys. E: Sci. Instrum. 21, pp. 242-250 (1988).

Ph. D Thesis of Toth, Ferry N., "A Design Methodology for Low-Cost, High-Performance Capacitive sensors", Delft University of Technology, The Netherlands, Delft University Press, ISBN 90-407-1407-X (1997).

Master of Science in Electrical Engineering Thesis of Hsieh, Ping-Hsuan, "CMOS LC Oscillators for Lower-Power MEMS Applications," University of California, Los Angeles, 2004.

Yamada, Mitsuhiro et al., "A Capacitive Pressure Sensor Interface using Oversampling Δ-Σ Demodulation Techniques," IEEE, vol. 46, No. 1, pp. 3-7, Feb. 1997.

Yang, W.Q., "A Self-Balancing Circuit to Measure Capacitance and Loss Conductance for Industrial Transducer Applications," IEEE, vol. 45, No. 6, pp. 955-958, Dec. 1996.

Boser, Bernhard E., "Capacitive Position Sense Circuits," Berkeley Sensor & Actuator Center, pp. 1-57, 1996.

Burstein, Amit et al., "Mixed Analog-Digital Highly Sensitive Sensor Interface Circuit for Low-Cost Microsensors," Sensors and Actuators, A 52, pp. 193-197, 1996.

Kung, Joseph T. et al., "Digital Cancellation of Noise and Offset for Capacitive Sensors," IEEE, vol. 42, No. 5, pp. 939-942, Oct. 1993.

Kung, Joseph T. et al., "A Digital Readout Technique for Capacitive Sensor Applications," IEEE, vol. 23, No. 4, pp. 972-977.

Leuthold, H. et al., "An ASIC for High-Resolution Capacitive Microaccelerometers," Sensors and Actuators, A21-23, pp. 278-281, 1990.

Lötters, Joost C. et al., "A Sensitive Differential Capacitance to Voltage Converter for Sensor Applications," IEEE, vol. 48, No. 1, pp. 89-96, Feb. 1999.

Shimizu, Hiromi et al., "A Digital Hygrometer," IEEE, vol. 37, No. 2, pp. 300-304, Jun. 1988.

Cichocki et al. "A Switched Capacitor Interface for Capacitive Sensors Based on Relaxation Oscillators", IEEE Transactions on Instrumentation and Measurement, vol. 39, No. 5, pp. 797-799 (Oct. 1990).

Philipp, H., "Charge Transfer Sensing: Spread Spectrum Technology Blazes New Applications," http://www.qprox.com/background/white_paper.php, 1997, 9 pages.

Yamada, M. et al., "A Switched Capacitor Interface for Capacitive Pressure Sensors", IEEE Transactions on Instrumentation and Measurement, vol. 31, No. 1, pp. 81-86 (Feb. 1992).

Baxter, Larry K., "Capacitive Sensors: Design and Applications", IEEE Press, ISBN 078035351X, Sections 4.2.1, 4.2.3, 4.2.4, 4.3.3, 4.5.1, 6.4.2, 10.3.5, and 11.4.2, 1997.

Kung, Joseph T., "Integrated Capacitive Sensors Using Charge-Redistribution Sense Techniques," MIT Department of Electrical Engineering and Computer Science, 2 pages, 1992.

* cited by examiner

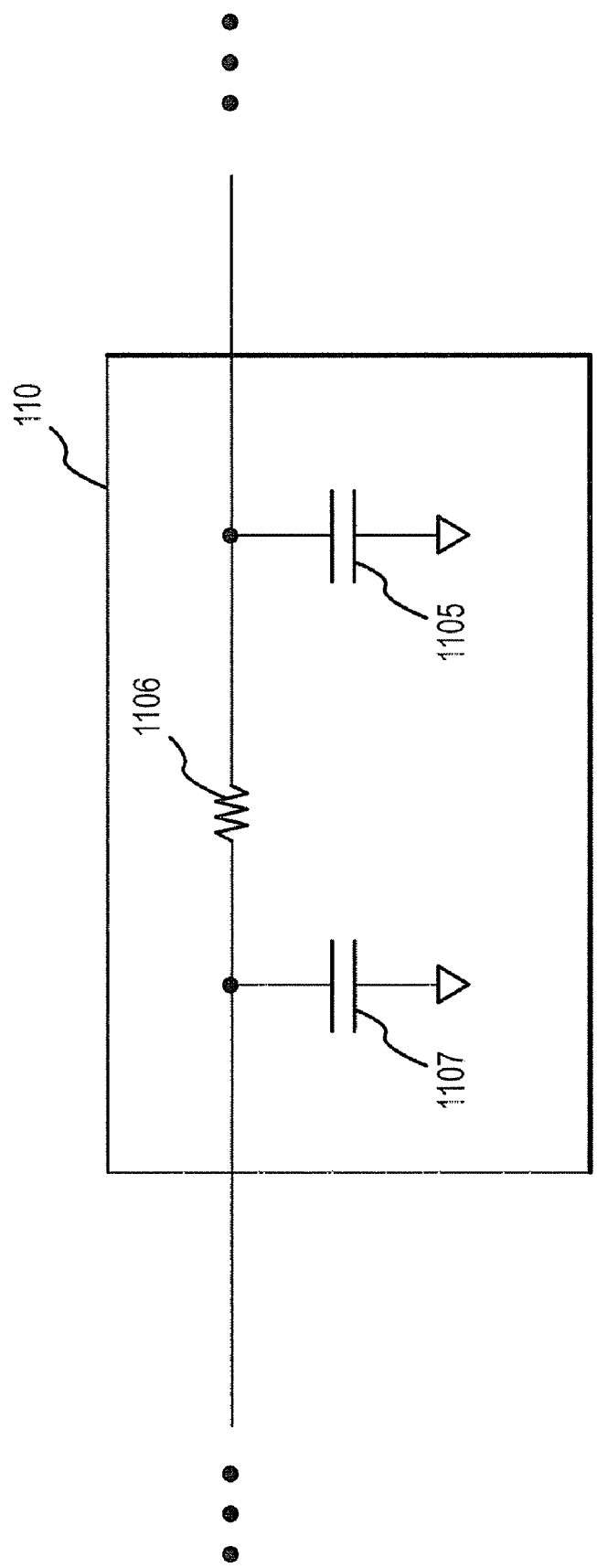

HALF-BRIDGE FOR CAPACITIVE SENSING

REFERENCE TO RELATED APPLICATIONS

This application claims priority to and the benefit of U.S. Provisional Application No. 60/753,501 filed Dec. 22, 2005, which provisional application is incorporated by reference, in its entirety.

FIELD OF THE INVENTION

The present invention generally relates to apparatus, systems, and methods for measuring a ratio of capacitances, which can be used to detect one or more conductive objects proximate to an apparatus or system, and more particularly, relates to capacitive sensing circuits.

BACKGROUND OF THE INVENTION

Capacitance sensors are used in a wide variety of applications, and are used in measuring force, pressure, liquid levels, inclination, positional information (such as distance, displacement, motion, and acceleration), and hosts of other purposes. Capacitance sensors/sensing systems that respond to charge, current, or voltage can be used to detect position or proximity (or motion, presence or any similar information), and are commonly used as input devices for computers, personal digital assistants (PDAs), media players and recorders, video game players, consumer electronics, cellular phones, payphones, point-of-sale terminals, automatic teller machines, kiosks and the like. Capacitive sensing techniques are used in applications such as user input buttons, slide controls, scroll rings, scroll strips and other types of inputs and controls. One type of capacitance sensor used in such applications is the button-type sensor, which can be used to provide information about the proximity or presence of an input. Another type of capacitance sensor used in such applications is the touchpad-type sensor, which can be used to provide information about an input such as the position, motion, and/or similar information along one axis (1-D sensor), two axes (2-D sensor), or more axes. Both the button-type and touchpad-type sensors can also optionally be configured to provide additional information such as some indication of the force, duration, or amount of capacitive coupling associated with the input. Examples of 1-D and 2-D touchpad-type sensors based on capacitive sensing technologies are described in United States Published Application 2004/0252109 A1 filed by Trent et al. and U.S. Pat. No. 5,880,411 issued to Gillespie et al. on Mar. 9, 1999. Such sensors can be readily found, for example, in input devices of electronic systems including handheld and notebook-type computers.

A user generally operates capacitive input devices by placing or moving one or more fingers, styli, and/or other objects near a sensing region of the sensor(s) located on or in the input device. This creates a capacitive effect upon a carrier signal applied to the sensing region that can be detected and correlated to positional information (such as the position(s) or proximity or motion or presences or similar information) of the stimulus/stimuli with respect to the sensing region. This positional information can in turn be used to select, move, scroll, or manipulate any combination of text, graphics, cursors, highlighters, and/or other indicators on a display screen. This positional information can also be used to enable the user to interact with an interface, such as to control volume, to adjust brightness, or to achieve any other purpose.

Although capacitance sensors have been widely adopted, sensor designers continue to look for ways to improve the sensors' functionality and effectiveness. In particular, it is continually desired to simplify the design and implementation of such sensors. Moreover, a need continually arises for a highly versatile yet low cost and easy to implement sensor design. In particular, a need exists for a sensor design scheme that is flexible enough to be easily implemented across a wide variety of applications yet powerful enough to provide accurate capacitance sensing, while at the same time remaining cost effective.

Accordingly, it is desirable to provide apparatus, systems, and methods for quickly, effectively, and efficiently detecting a variable capacitance. Moreover, it is desirable to create a scheme that can be implemented using readily available components, such as standard ICs, microcontrollers, and discrete components. Other desirable features and characteristics will become apparent from the subsequent detailed description and the appended claims, taken in conjunction with the accompanying drawings and the foregoing technical field and background.

BRIEF SUMMARY OF THE INVENTION

An apparatus is provided for measuring a ratio of capacitances, which can be used to detect one or more conductive objects proximate to the apparatus. The ratio of capacitances can be used to derive positional information about the conductive object(s) relative to the apparatus. The apparatus, in one embodiment, comprises a first comparator including a first comparator input, a first comparator output, and a first reference voltage. Furthermore, the apparatus comprises a first capacitive element including a first capacitance, a first electrode coupled to the comparator input and a first biasing element, and a second electrode. A digitally-controlled voltage waveform generator for generating a varying waveform and including a voltage waveform generator output is coupled to the second electrode of the first capacitive element. Moreover, the apparatus includes a second capacitive element including a second capacitance and a third electrode coupled to the comparator input. A controller configured to control the digitally-controlled voltage waveform generator is coupled to the comparator output such that a first output signal of the comparator is dependent on a first ratio comprising the first capacitance and the second capacitance, and wherein the first capacitive element and/or the second capacitive element is a variable capacitive element.

A method is provided for generating a first comparator output signal dependent on a ratio including a first capacitance ($C_1$) of a first capacitive element and a second capacitance ($C_2$) of a second capacitive element. The method comprises the steps of setting an initial voltage across the first capacitive element; generating a varying voltage waveform ($V_w$), applying $V_w$ to at least one of the first capacitive element and the second capacitive element to generate a first voltage ($V_{n1}$) such that $V_{n1}$ exhibits values above and below a first reference voltage ($V_{ref1}$) at different capacitance ratios, wherein a change in $V_{n1}$ is substantially dependent on the ratio including the first capacitance and the second capacitance; comparing $V_{n1}$ to $V_{ref1}$; and generating the first comparator output signal, wherein the first comparator output signal changes state in response to $V_{n1}$ crossing from one of being below $V_{ref1}$ to being above $V_{ref1}$ and from being above $V_{ref1}$ to being below $V_{ref1}$, and wherein a change in $V_w$ is representative of a first ratio including the first capacitance and the second capacitance when $V_{n1}$ is substantially equal to $V_{refl}$.

BRIEF DESCRIPTION OF THE DRAWINGS

The present invention will hereinafter be described in conjunction with the following drawing figures, wherein like numerals denote like elements.

FIG. 1B is a diagram illustrating one embodiment of a voltage waveform generator using passive components and a digital output of a control logic;

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
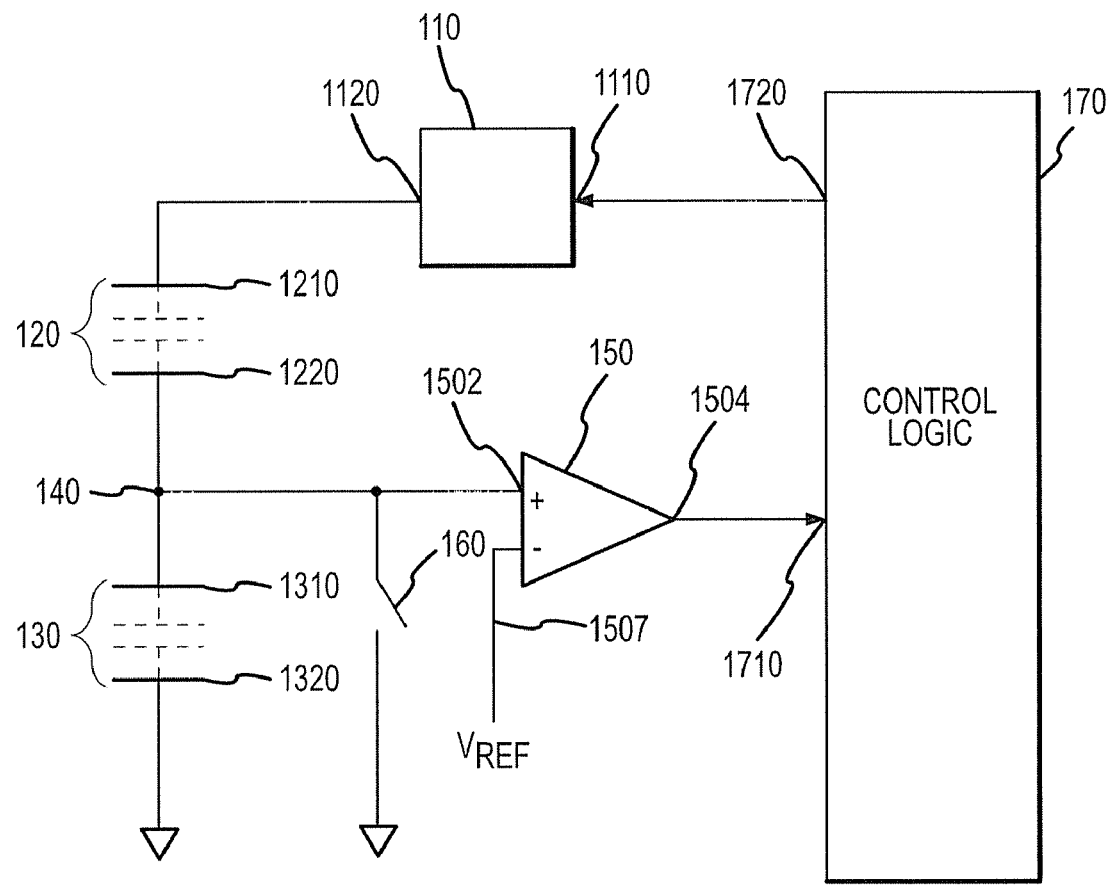
FIG. 1 is a diagram illustrating embodiments of a sensing circuit for measuring a ratio of capacitances with high side drive and low side comparison.

FIG. 1 is a diagram illustrating one embodiment of a sensing circuit 100 for measuring a ratio of capacitances that can be used in capacitance sensors. This ratio of capacitances can be used directly to provide information, or indirectly as input data for deriving one or more absolute or relative measurements of at least one of the capacitances in the ratio of capacitances. In a likely usage model, the ratio of capacitance changes when a conductive or high dielectric object (not shown) is moved proximate to a sensor electrode of sensing circuit 100 and coupled to one of the capacitive sensing electrodes. In one embodiment, sensing circuit 100 includes a waveform generator 110 (e.g., a digitally-controlled voltage waveform generator) having a waveform generator input 1110 and a waveform generator output 1120.

Waveform generator 110 is suitably any hardware, device, sensing circuit, software, and/or logic suitably configured to generate a signal having a waveform. The term "varying waveform" may mean either a discretely varying waveform or a continuously varying waveform. In other words, the voltage waveform generated by waveform generator 110 may change discontinuously to increase and/or decrease in voltage (e.g., in discrete steps) or may change smoothly to increase and/or decrease in voltage (including increasing substantially continuously, with roughly continuous variation having the discrete steps characteristic of digital systems, for example). Waveforms usable by sensing circuit 110 include, but are not limited to, ramps with substantially continuous variations, stepped waves with discrete variations, triangle waves, saw tooth waves, sinusoidal waves, combinations thereof, and the like.

In one embodiment, waveform generator 110 is a digital-to-analog converter. DACs are commonly available, and any DAC capable of producing the desired varying waveform can be used as waveform generator 110. In addition, waveform generator can be a physically discrete component (e.g. a discrete DAC) or a part of a larger integrated circuit (e.g. a DAC within a microcontroller).

In another embodiment, waveform generator 110 is implemented as a resistor-capacitor (RC) circuit (not shown) coupled to a charge source (not shown). In this embodiment, a voltage source may be configured to provide two voltages to the RC circuit, and control logic 170 may be configured to switch between these two voltages. In an alternative embodiment, control logic 170 may be configured to switch between more than two voltages. As an example of such an embodiment, FIG. 1B shows a filter capacitance 1107 and a filter resistance 1106 (and optionally a capacitor 1105) that may generate a continuous or quantized voltage output using passive components and a digital output of control logic 170 (e.g., a controller). This embodiment is capable of generating a continuous exponentially decaying voltage ramp, a voltage ramp in discrete steps, or a roughly stable voltage dependent on a pulse-width or pulse-coded output.

In accordance with one embodiment, the two voltages are the power supply voltages of $V_{dd}$ and ground (GND). In another embodiment, the voltage source is implemented using a single digital output of a microcontroller, and these two voltages are the HIGH and LOW outputs that can be supplied by the digital output. In yet another embodiment, control logic 170 outputs control signals that causes the voltage source to provide a step function to the RC circuit from a first voltage to a second voltage such that the step function would cause waveform generator 110 to output a continuously varying waveform known as a voltage ramp which exponentially decays from the first voltage to the second voltage. If a digital output is used, $V_w$ would substantially "trace out" an exponentially decaying rise from LOW to HIGH in response to a step function that changes from LOW to HIGH, and would substantially trace out an exponentially decaying decrease in response to a step function that changes from HIGH to LOW. In still another embodiment, control logic 170 outputs control signals that cause the voltage source to switch between the two voltages in a pulse modulated manner, such that waveform generator 110 is effectively a pulse modulated signal generator (e.g., a pulse width modulated signal generator, a pulse code modulated signal generator, and/or a pulse amplitude modulated signal generator, and the like pulse modulated signal generators).

Furthermore, sensing circuit 100 includes a capacitive element 120 having a capacitive element electrode 1210 and a capacitive element electrode 1220, wherein capacitive element 120, in one embodiment, is coupled in series with waveform generator 110 via capacitive element electrode 1210 and waveform generator output 1120. Capacitive element 120 may be any hardware, device, and/or circuitry suitably configured to store an amount of electric charge for a given electric potential. In one embodiment, capacitive element 120 is one or more discrete capacitors while, in another embodiment, at least part of capacitive element 120 is integrated with an integrated circuit, a printed circuit board, or other circuitry. In an embodiment, capacitive element 120 has a fixed capacitance in the range of about 1 pF to about 100 pF. In yet another embodiment, capacitive element 120 has a variable capacitance in the range of about 2 pF to about 101 pF.

Sensing circuit 100 includes a capacitive element 130 having a capacitive element electrode 1310 and a capacitive element electrode 1320. Capacitive element 130, in one embodiment, is coupled in series with capacitive element 120 by capacitive element electrode 1310 and capacitive element electrode 1220 via a node 140. In addition, capacitive element 130 may be coupled to any AC or chassis ground via capacitive element electrode 1320. The chassis ground may be the same as the circuit ground in some embodiments, but it need only be a relatively stable voltage for some period of the measurement for others. In addition, capacitive element 130 may also be coupled to a digital output of controller 170, which may drive multiple similar capacitances.

Capacitive element 130 may be any hardware, device, and/or circuitry suitably configured to store an amount of electric charge for a given electric potential. In one embodiment, capacitive element 130 is one or more discrete capacitors while, in another embodiment, at least part of capacitive element 130 is integrated within an integrated circuit or a printed circuit board.

Similar to capacitive element 120, capacitive element 130 may have a fixed capacitance in the range of about 1 pF to about 100 pF. Furthermore, capacitive element 130 may have a variable capacitance in the range of about 2 pF to about 101 pF.

In one embodiment, capacitive element 120 is implemented as a fixed capacitor and capacitive element 130 is implemented to have a variable capacitance ($C_X$). In this embodiment, capacitive element 120 is a capacitor having a fixed capacitance between capacitive element electrode 1210 and capacitive element electrode 1220 (as shown by the dotted line in FIG. 1), and capacitive element 130 is a capacitor having variable capacitance $C_X$ between capacitive element electrode 1310 and capacitive element electrode 1320 (as shown by the dotted line in FIG. 1). Moreover, capacitive element 130 is implemented with a sensor electrode (represented as capacitive element electrode 1310 or 1320), and the variable capacitance is configured to be determined, at least in part, by the proximity of one or more conductive objects (not shown) near the sensor electrode.

Alternatively, in another embodiment, capacitive element 130 is implemented as a fixed capacitor and capacitive element 120 is implemented having a variable capacitance, $C_X$. In this embodiment, capacitive element 130 is a capacitor having a fixed capacitance between capacitive element electrode 1310 and capacitive element electrode 1320 and capacitive element 120 is a capacitor having a variable capacitance between capacitive element electrode 1210 and capacitive element electrode 1220. Moreover, capacitive element 120 is implemented with a sensor electrode (represented as capacitive element electrode 1210 or 1220) and the variable capacitance is configured to be determined, at least in part, by the proximity of one or more conductive objects (not shown) near the sensor electrode.

Sensing circuit 100 includes a comparator 150 having a comparator input 1502, a comparator output 1504, and a reference voltage 1507. Comparator 150 may be any hardware, software, device, and/or circuitry suitably configured to compare two voltages (e.g., the voltage at comparator input 1502 and reference voltage 1507) and switch the state of its output signal to indicate which is larger. In one embodiment, comparator 150 is a comparator manufactured by Analog Devices, Inc. of Norwood, Mass.

In one embodiment, comparator 150 is implemented discretely, such as with an operational amplifier without negative feedback (e.g., with positive feedback). In another embodiment, comparator 150 is implemented as a digital input of a microcontroller (discussed in greater detail below), where the reference voltage is the threshold of the digital input.

As illustrated, comparator input 1502 is coupled to both capacitive element electrode 1220 and capacitive element electrode 1310 via node 140. In addition, reference voltage 1507 is a voltage in the range of about −5 volts to about 5 volts.

Furthermore, sensing circuit 100 includes a biasing element 160 coupled to capacitive element electrode 1220 and capacitive element electrode 1310 for setting an initial voltage. Biasing element 160 is used to "clear" any residual charge prior to waveform generator 110 transmitting additional charge to capacitive elements 120 and 130.

In one embodiment, biasing element 160 is a switch such as, for example, a single pole, single throw (SPST) switch or other similar type of switch capable of being controlled by control logic, a controller, and/or a microcontroller and capable of being integrated with circuitry or microcontrollers. In another embodiment, biasing element 160 is a resistive element having a resistance in the range of about 1 MΩ to about 1 GΩ.

When implemented as a switch, biasing element 160 may be closed to set the initial voltage of sensing circuit 100. When implemented as a resistive element, biasing element 160 may be any hardware, device, and/or circuitry suitably configured to produce a voltage across it in accordance with Ohm's law, such that current will pass through biasing element 160 with time to set the initial voltage.

Sensing circuit 100 suitably includes control logic 170 having a control logic input 1710 and a control logic output 1720 coupled to comparator output 1504 and waveform generator input 1110, respectively. Control logic 170 may be any device, hardware, software, and/or circuitry suitably configured to transmit control signals to waveform generator 110 via control logic output 1720 and receive output signals from comparator 150 via control logic input 1710. In one embodiment, control logic 170 is suitably configured to transmit a predefined control signal sequence to waveform generator 110 to cause a predefined voltage waveform configured to cause the output signals of comparator 150 to change state if one or more objects (e.g., finger, stylus, etc.) is proximate to the sensor electrode. In a further embodiment, control logic 170 can be configured to transmit additional control signals to waveform generator 110 to cause a predefined "reverse" voltage waveform that would cause the comparator output signals to change state again. Accordingly, if the predefined voltage waveform causes the comparator to change state when the voltage at node 140 passes the reference voltage 1507 in a rising manner, then the predefined "reverse" voltage waveform causes the comparator to change state when the voltage at node 140 passes the reference voltage 1507 in a falling manner. Obtaining measurements for both rising and falling voltage waveforms is often useful in rejecting slowly varying noise, such as those associated with background changes such as temperature, power supply, and the like.

In another embodiment, control logic 170 is suitably configured to transmit control signals to waveform generator 110 based on the "state" of the output signals received from comparator 150, wherein the state of the output signals is determined by the result of the comparison of the voltage at node 140 to reference voltage 1507 and a change in state (also termed "tripping" of the comparator 150) indicates that the voltage at node 140 has passed reference voltage 1507. In one embodiment, control logic 170 responds to a change in state of the output signals by ending a predefined control signal sequence to end the varying waveform provided by waveform generator 110. In another embodiment, control logic 170 responds in a more complex manner, and changes the control signal sequence in response to the change in state (or lack thereof) of the output signals of comparator 150, which allows sensing circuit 100 to attain improved performance.

For example, control logic 170 may increase the speed at which sensing circuit 100 measures the ratio of capacitances by using the control signals to apply an algorithm (e.g. a searching algorithm) that causes waveform generator 110 to vary the voltage waveform to voltage values that would cause the comparator to change state more quickly. That is, control logic 170 provides adequate resolution more quickly by spending relatively more time when the comparator is near its reference voltage and less time at other voltages. Alternatively, control logic 170 may improve the resolution of sensing circuit 100 by using the control signals to decrease the rate or amount of change of the variation when the voltage of the waveform is close to what may cause the output signals of comparator 150 to change state.

As another alternative, control logic 170 may improve the accuracy of sensing circuit 100 by causing waveform generator 110 to produce multiple varying waveforms with relatively smaller variation, but which all cause the state of the output signals to change, which allows sensing circuit 100 to obtain multiple measurements of the ratio of capacitances and improve accuracy, reliability, and noise rejection. The number of repetitions may be predefined or determined dynamically based on predetermined criteria, such as noise. This type of dynamic control of the varying waveform may be more easily implemented when waveform generator 110 includes a DAC or another component with a directly controllable voltage output level; however, through proper modulation such as pulse modulation control, dynamic control of the voltage waveform $V_w$ values may also be achieved with a simple digital output.

In another embodiment, control logic 170 is implemented with a microcontroller manufactured by Cypress Semiconductor Corporation of San Jose, Calif. The microcontroller suitably implements (and thus physically includes) waveform generator 110 (such as via an internal DAC), comparator 150 (such as via a digital input such as a CMOS input), or biasing element 160 (such as via a digital output). In yet another embodiment, the microcontroller implements waveform generator 110 and either comparator 150 or biasing element 160. In an alternate embodiment, the microcontroller implements both comparator 150 and biasing element 160 (such as with a single digital input/output). In still another embodiment, the microcontroller implements each of waveform generator 110, biasing element 160, and comparator 150. Notably, some embodiments may include external associated passive components.

The following example may be helpful in understanding the operation of sensing circuit 100. In this example, capacitive element 120 has a fixed capacitance ($C_1$) and capacitive element 130 includes a sensor electrode and has a variable capacitance $C_X$ (also termed $C_2$). Furthermore, $C_1$ is selected to roughly approximate the average capacitance of $C_2$ to increase the resolution of $C_2$ values that may be sensed. Moreover, waveform generator 110 is a DAC outputting a variable voltage ($V_w$) that ramps upwards between ground and a known voltage ($V_{dd}$) (e.g., 10 volts). Moreover, reference voltage 1507 is set to $V_{dd}/4$ (2.5 volts in this example) and biasing element 160 is an SPST switch.

Waveform generator 110 outputs voltage $V_w$ to capacitive elements 120 and 130 when biasing element 160 is not being used to ground node 140, resulting in a voltage ($V_n$) at node 140, which can be represented by an equation including a ratio of capacitance $C_1$ and $C_2$ (this equation ignores noise, offsets, stray capacitances, other non-idealities, etc.):

$$V_n = V_w(C_1/(C_1+C_2)). \quad \text{(equation 1)}$$

In this manner, assuming that $C_1$ equals $C_2$, the voltage at node 140 (which is the voltage across $C_2$) would be close to or slightly greater than $V_{dd}/4$ when waveform generator 110 is outputting $V_w$ at close to or slightly greater than $V_{dd}/2$ (5 volts in this example) since $(C_1/(C_1+C_2))=0.5$. Since the reference voltage 1507 is set to $V_{dd}/4$, this voltage slightly greater than $V_{dd}/4$ across $C_2$ would cause comparator 150 to trip resulting in its output signal changing state when waveform generator 110 is slightly more than midway through its range of $V_w$ output values.

In exemplary operation, if stray charge needs to be discharged from sensing circuit 100, biasing element 160 is closed while $V_w$ is driven to a predetermined voltage (e.g., ground). Next, biasing element 160 is opened and waveform generator 110 outputs $V_w$ in steps to another voltage between ground (i.e., 0 volts) and $V_{dd}$ (e.g., 10 volts) until the voltage at node 140 (which is also the voltage across capacitive element 130 ($C_2$)) is greater than reference voltage 1507 and comparator 150 trips.

Once comparator 150 trips, waveform generator 110 prepares for the next varying voltage waveform to be produced. Control logic 170 is then able to determine the voltage of $V_w$ at the time comparator 150 tripped to measure the ratio of capacitance. In the case when waveform generator 110 is a DAC and control logic 170 directly dictates the value of $V_w$, this would be the voltage value that control 170 directed. For other systems where the varying voltage is not a directly known value but is predictable as a function of time, time can be used to ascertain the voltage. The measured ratio of capacitances in this example can then be used in determining positional information about one or more conductive objects relative to capacitive element 130.

For example, sensing circuit 100 can be configured to detect the proximity of a conductive object relative to a sensor electrode of, for example, capacitive element 130, and indicate a button-type input in response. When comparator 150 changes the state of its output signals when waveform generator 110 is slightly more than midway through the $V_w$ range ($V_{dd}/2$), this indicates a ratio of capacitances that is representative of a conductive object within a threshold proximity to the sensor electrode of capacitive element 130. In this example, the threshold proximity is the proximity needed to define a $C_2$ value such that comparator 150 will trip when $V_w$ has a value just past $V_{dd}/2$, and is determined by parameters of the conductive object, values of the various components of sensing circuit 100, reference voltage 1507, and power supply voltages, etc.

In contrast, when comparator 150 changes the state of its output signals when $V_w$ is a quarter of its way through its range ($V_{dd}/4$), this indicates a ratio of capacitances that is representative of no conductive object within threshold proximity of the sensor electrode. Thus, if $V_w$ is equal to or greater than $V_{dd}/2$ (5 volts) when comparator 150 changes the state of its output signal, control logic 170 determines that a conductive object is sufficiently close to the sensor electrode of element 130, and can use this information to provide a signal to an electronic device that simulates a button input.

In another embodiment, control logic 170 uses the value of $V_w$ to derive a measurement of $C_X$ (also $C_2$) or a comparison of $C_X$ to $C_1$ using EQ. 1. Solving EQ. 1 for the ratio of $C_X$ to $C_1$ yields:

$$C_2/C_1 = (V_w - V_n)/V_n. \quad \text{(equation 2)}$$

By knowing the values of $V_w$ when comparator 150 tripped, and knowing the voltage of reference voltage 1507 that defines the $V_n$ at which comparator 150 would trip, Equation 2 can be used to calculate the ratio of $C_2/C_1$. If $C_1$ is a fixed, known value, then $C_2$ can be calculated as:

$$C_2 = C_1((V_w - V_n)/V_n). \quad \text{(equation 3)}$$

The value of $C_2$ or the ratio of $C_2/C_1$ may be used by control logic 170, or an electronic system with which control logic 170 is in communication, to ascertain information about what has been sensed and/or its proximity to the sensor electrode. Notably, other embodiments may include more complex algorithms (including dynamic offsets, hysteresis, filtering, and the like) for determining touch, position, and/or motion.

As indicated, waveform generator 110 may transmit differing amounts of voltage to capacitive elements 120 and 130, and control logic 170 may determine whether the voltage is greater than or less than a threshold voltage utilizing a process known as "successive approximation." The resolution, in one exemplary embodiment, is a 12 bit resolution, although other resolutions are contemplated by the invention.

Figure 1A:
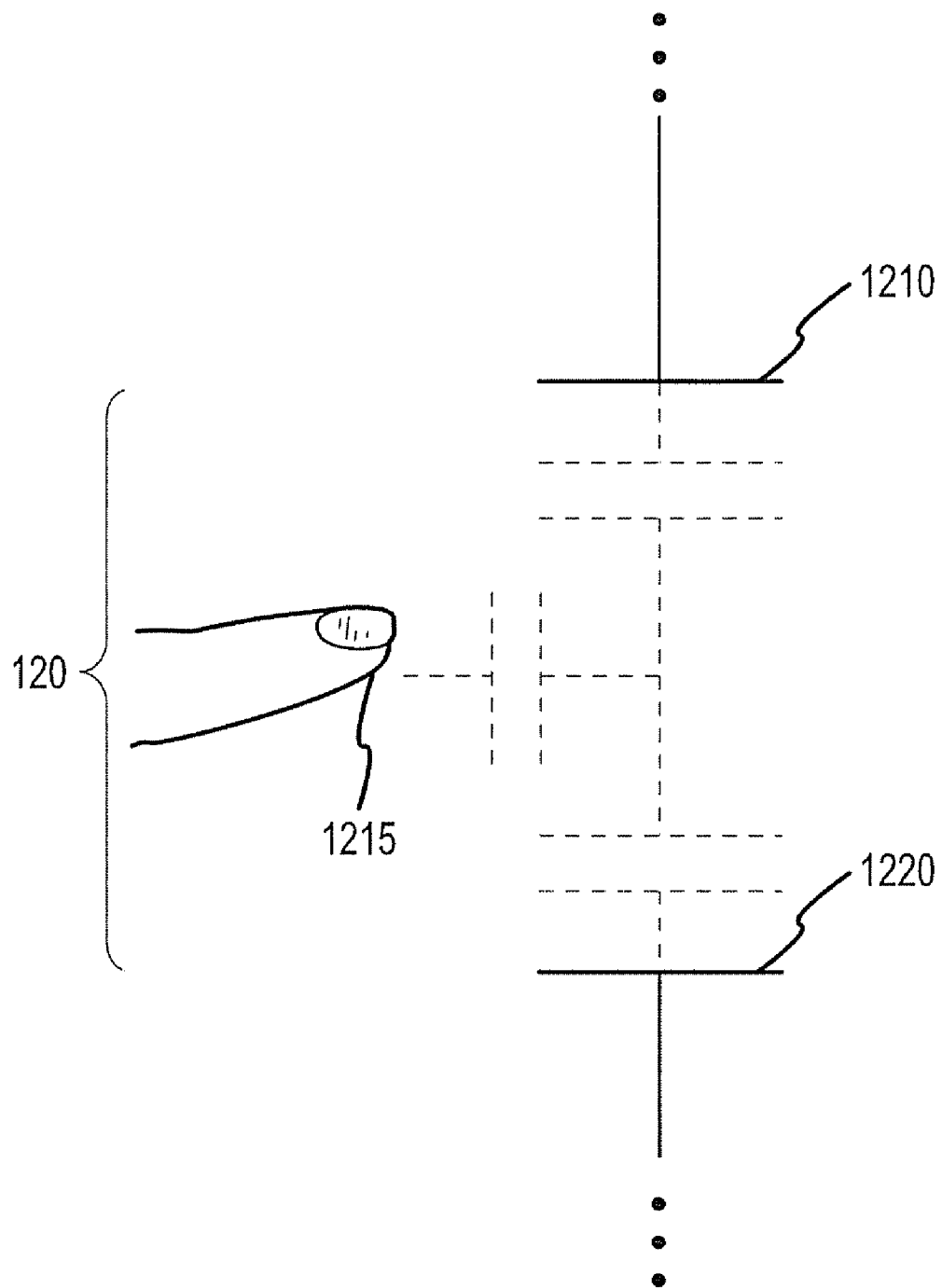
FIG. 1A is a diagram illustrating a model of the transcapacitive effect of a finger on a capacitive coupling.

Notably, the above example describes capacitive element 120 as having a fixed capacitance and capacitive element 130 as having a variable capacitance $C_X$ in an arrangement known as "absolute capacitance." It should be noted that sensing circuit 100 works in a similar manner when capacitive element 130 has a fixed capacitance and capacitive element 120 has a variable capacitance $C_X$, known as "transcapacitance," or when both capacitive element 120 and capacitive element 130 have variable capacitances $C_{X1}$ and $C_{X2}$, respectively. In accordance with one transcapacitance embodiment, the coupling capacitance through capacitive element 120 via electrodes 1210 and 1220 is reduced by the presence of another electrode 1215, which could be, for example, a finger as shown in FIG. 1A. In another transcapacitance embodiment, a high dielectric stylus may be utilized to increase the coupling between electrodes 1210 and 1220.

Figure 2:
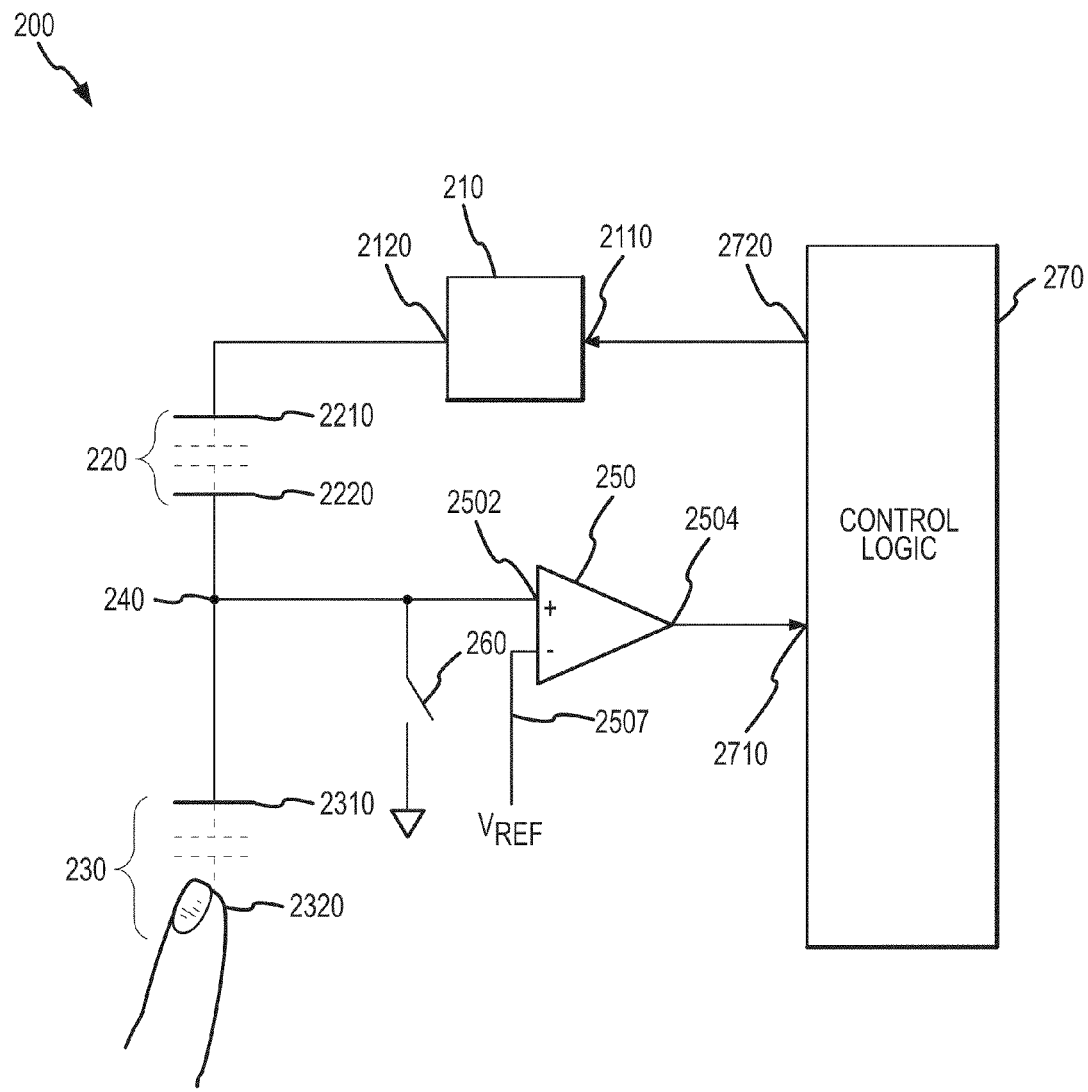
FIG. 2 is a diagram illustrating another embodiment of a sensing circuit for measuring a ratio of capacitances to detect absolute capacitance variations with high side drive and low side comparison.

FIG. 2 is a diagram of another embodiment of a sensing circuit 200 for measuring a ratio of capacitances, which can be used to enable sensing circuit 200 to detect positional information about an object (not shown) proximate to sensor electrode(s) of sensing circuit 200 in an arrangement termed herein as "absolute capacitance." In one embodiment, sensing circuit 200 includes a waveform generator 210 coupled to a control logic 270 similar to waveform generator 110 coupled to control logic 170 discussed above. Furthermore, sensing circuit 200 includes a comparator 250 having a reference voltage 2507 coupled to control logic 270 similar to comparator 150 coupled to control logic 170 discussed above. Moreover, waveform generator 210, control logic 270, and comparator 250 are each suitably configured similar to the various embodiments of waveform generator 110, control logic 170, and comparator 150 discussed above, respectively.

In one embodiment, sensing circuit 200 includes a capacitive element 220 coupled to waveform generator 210 similar to capacitive element 120 coupled to waveform generator 110 discussed above. Moreover, capacitive element 220 includes capacitive element electrodes 2210 and 2220 and is suitably configured similar to the various embodiments of capacitive element 120 discussed above.

Furthermore, sensing circuit 200 includes a capacitive element 230 coupled to capacitive element 220 (via capacitive element electrode 2220), biasing element 260, and comparator 250 via a node 240, wherein biasing element 260 may be suitably configured similar to the various embodiments of biasing element 160 discussed above. In one embodiment, capacitive element 230 is implemented with a sensor electrode 2310, and capacitive element 230 has a variable capacitance $C_X$ that is configured to be determined, at least in part, by the proximity of a conductive object near sensor electrode 2310.

In one embodiment, capacitive element 230 includes a capacitance in the range of about 1 pF to about 100 pF when an external conductive object (e.g., human finger, stylus, etc.) is not located proximate to sensor electrode 2310. Furthermore, capacitive element 230 includes a capacitance in the range of about 2 pF to about 101 pF when an external conductive object is located proximate to sensor electrode 2310. For example, capacitive element 230 is suitably configured to act as a first capacitance when a conductive object is not within a threshold proximity to sensor electrode 2310 and act as a second, different capacitance when a conductive object is within the threshold proximity to sensor electrode 2310. As such, the conductive object essentially functions as a second capacitive element electrode when the conductive object is within the threshold proximity to sensor electrode 2310. Other relatively static stray or background capacitances may also be present. Accordingly, FIG. 2 illustrates that, for example, a human finger may become capacitive element electrode 2320 to increase the capacitance of capacitive element 230 when the human finger is within the threshold proximity to sensor electrode 2310, which is represented by the dotted lines. Moreover, other conductive objects such as, for example, a stylus or other conductive object may become capacitive element electrode 2320 when sufficiently proximate to sensor electrode 2310.

Figure 3:
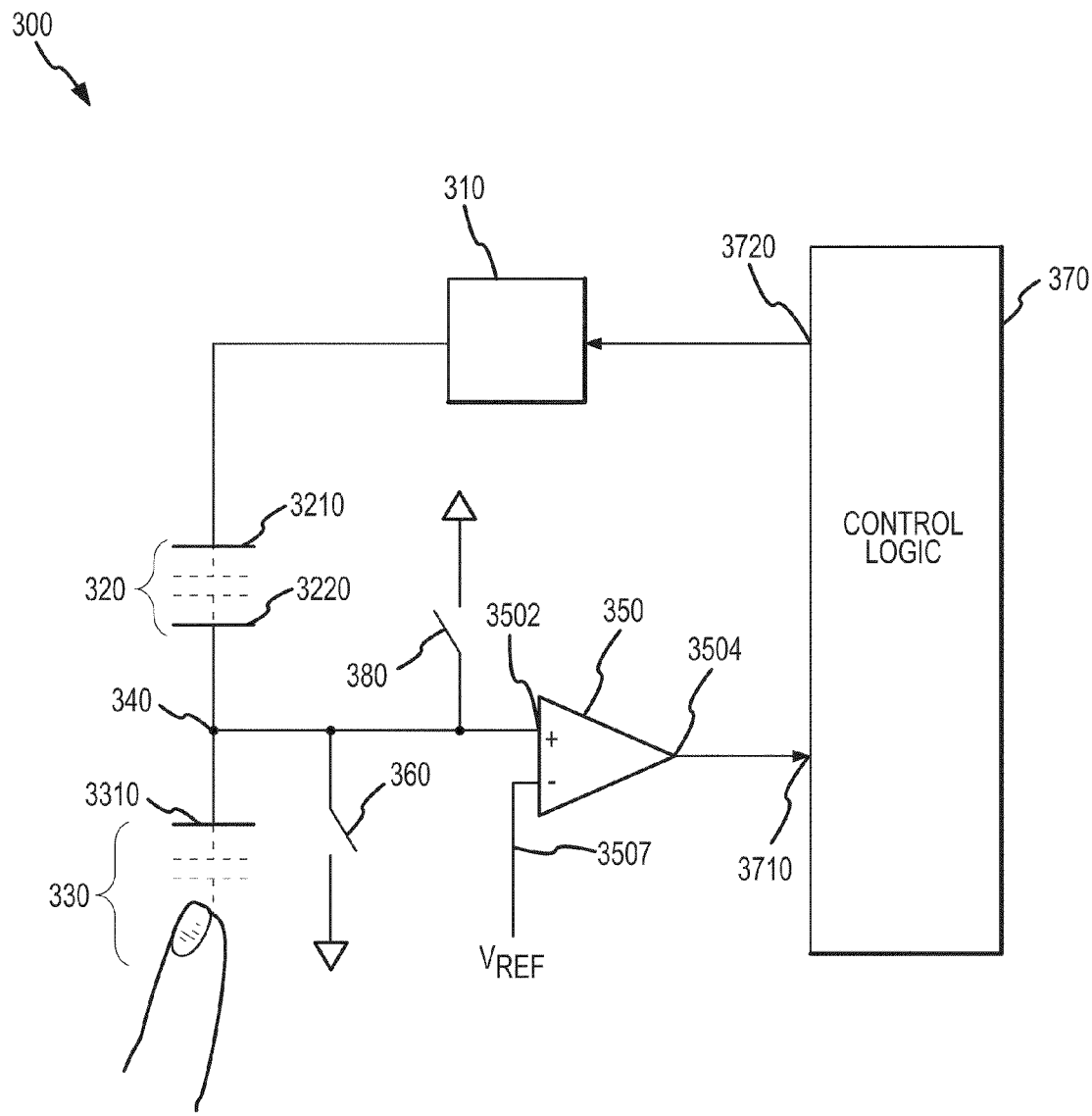
FIG. 3 is a diagram illustrating yet another embodiment of a sensing circuit for measuring a ratio of capacitances to detect differential absolute capacitance variations with high side drive and low side comparison.

FIG. 3 is a diagram of yet another embodiment of a sensing circuit 300 for measuring a ratio of capacitances, which can be used to enable sensing circuit 300 to detect positional information about a conductive object (not shown) is proximate to sensor electrode(s) of sensing circuit 300 in an "absolute capacitance" configuration. In one embodiment, sensing circuit 300 includes a waveform generator 310, capacitive elements 320 (which includes a capacitive element electrode 3210 coupled to waveform generator 310) and 330, a node 340, a comparator 350 having a comparator output 3504, a switch 360, and control logic 370 coupled to waveform generator 310 via a control logic output 3720 and to comparator output 3504 via a control logic input 3710 similar to waveform generator 210, capacitive elements 220 and 230, a node 240, a comparator 250, a switch 260, and control 270 discussed above. In addition, sensing circuit 300 includes a switch 380 coupled to each of a comparator input 3502, capacitive element electrode 3220, and a capacitive element electrode 3310 in addition to bias element 360.

In one embodiment, switch 380 is a SPST switch. In another embodiment switch 380 is configured to drive a node 340 to a second voltage other than ground when switch 380 is closed. For example, this second voltage may be the maximum voltage $V_{dd}$ expected at node 340 for typical operation of the sensor 300. As another example, the second voltage may be $V_{dd}/2$.

In one embodiment, at least one of waveform generator 310, comparator 350, biasing element 360, and switch 380 comprises at least a portion of a microcontroller (e.g., implemented via a digital input or digital output of the microcontroller, which may be part of a digital I/O). In another embodiment, at least two of waveform generator 310, comparator 350, biasing element 360, and switch 380 comprise at least a portion of the microcontroller. In yet another embodiment, at least three of waveform generator 310, comparator 350, biasing element 360, and switch 380 comprise at least a portion of the microcontroller. In still another embodiment, each of waveform generator 310, comparator 350, biasing element 360, and switch 380 comprise at least a portion of the microcontroller. Passive components external to a microcontroller may also be utilized as elements of other embodiments. For example, waveform generator 310 may include an internal DAC of a microcontroller, or the waveform generator 310 may include a digital output of a microcontroller (which may optionally be pulse modulated). As another example, all three of comparator 350, biasing element 360, and switch 380 may be implemented using a single digital I/O of a microcontroller; in such a case, the "high impedance-read" state of the digital input is used for implementing comparator 350, and the LOW and HIGH outputs available to the digital output are used to implement biasing element 360 and switch 380, respectively. Moreover, various embodiments contemplate that at least two of waveform generator 310, comparator 350, biasing element 360, and switch 380 comprise at least portions of two different microcontrollers.

During operation of an embodiment, if needed to clear stray charge, the voltage waveform generator 310 is set to output GND, switch 380 is opened, and biasing element 360 is utilized to ground both capacitive elements 320 and 330. Waveform generator 310 then outputs $V_w$ (for example, a rising ramp) until the voltage across the capacitive element 330 is greater than reference voltage 3507 and comparator 350 output signal changes state. Next, switch 380 is momentarily closed to set the node 340 to the second voltage and the voltage waveform generator 310 is set to output the appropriate $V_w$ value to bring it to approximately the second voltage. Next, after switch 380 is opened, waveform generator 310 outputs $V_w$ (for example, a falling ramp) until the voltage across the capacitive element 330 is less than reference voltage 3507 and comparator 350 output signal changes state again. Accordingly, the output signals of comparator 350 will change state when the voltage at node 340 is past the reference voltage 3507, such as when the voltage at node 340 changes from being less than reference voltage 3507 to being greater than reference voltage 3507, and when the voltage at node 340 changes from being greater than reference voltage 3507 to being less than reference voltage 3507. Obtaining readings for both rising and falling $V_w$ can be quite useful in rejecting relatively slowly varying noise, such as those associated with background changes, power supply variations, and the like.

Notably, although sensing circuit 300 has been discussed with respect to an absolute capacitance configuration, various embodiments of the invention contemplate that sensing circuit 300 may be implemented utilizing a transcapacitance configuration. Accordingly, capacitive element 320 may look similar to capacitive element 120 discussed above with reference to FIG. 1A.

Figure 4:
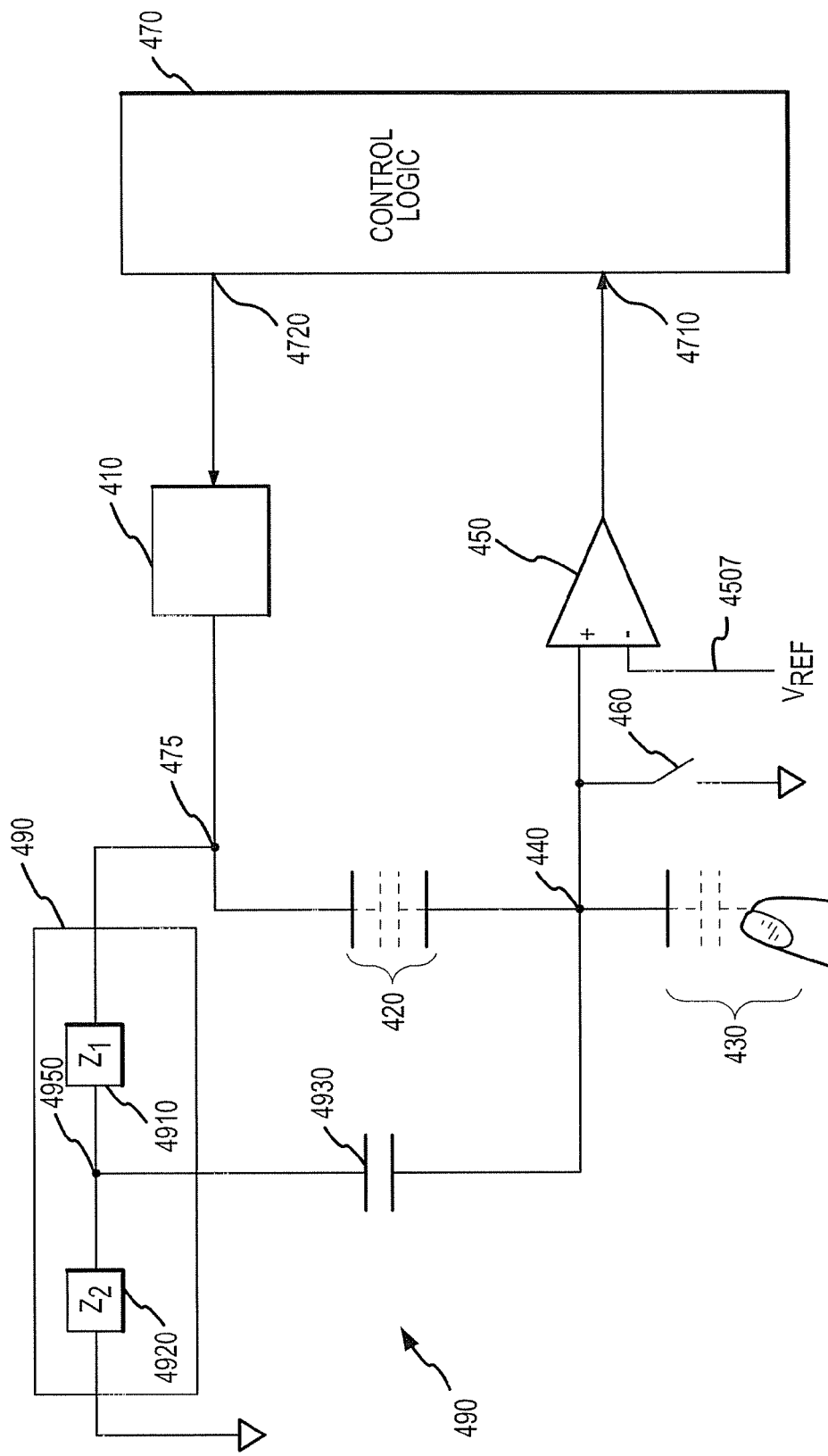
FIG. 4 is a diagram illustrating still another embodiment of a sensing circuit for measuring a ratio of capacitances to detect guarded absolute capacitance variations with high side drive and low side comparison.

FIG. 4 is a diagram of one embodiment of a sensing circuit 400 for measuring a ratio of capacitances, which can be used for sensing input by a conductive object (not shown). Sensing circuit 400 includes a waveform generator 410, capacitive elements 420 and 430, a node 440, a comparator 450 coupled to a reference voltage 4507, a switch 460, and control logic 470 coupled to waveform generator 410 via a control logic output 4720 and to comparator 450 via a control logic input 4710 similar to waveform generator 210, capacitive elements 220 and 230, node 240, comparator 250, switch 260, and control 270 discussed above. In one embodiment, sensing circuit 400 includes a guarding circuit 490 having a guard signal node 4950 for driving a guard signal onto guard electrode(s).

Guarding circuit 490, in one embodiment, includes a plurality of impedance elements (e.g., impedance element 4910 and impedance element 4920), wherein impedance elements 4910 and 4920 are coupled to each other such that they form a voltage divider when driven by a voltage applied at a node 475 and divides the voltage applied at node 475 to produce the guard signal at guard signal node 4950. Guarding circuit 490 may be coupled to the rest of sensing circuit 400 via node 475 between waveform generator 410 and capacitive element 420. In an embodiment, guard signal node 4950 is coupled to a guarding electrode 4930 located proximate to sensor electrode(s) of capacitive elements 420 and/or 430 and drives the guard signal onto guarding electrode 4930. Guarding electrode 4930 is configured to guard the sensor electrode(s) of capacitive element 420 and/or 430 from noise and changes in charge due to stray currents, and thus can be modeled as being capacitively coupled through guarded capacitance 4930 to node 440.

In a preferred embodiment, the guarding voltage on guard signal node 4950 should be relatively low impedance with a voltage swing comparable to that found on node 440. In a further embodiment, guarding circuit 490 may be coupled to sensing circuit 400 by control logic 470, and the voltage on node 475 is determined by a digital output of control logic 470. In various embodiments the voltage at node 4950 may be monitored by a comparator connected to control logic 470 to provide a reference for to improve power supply, threshold, and/or other variations in sensing circuit 400.

In one embodiment, impedance elements 4910 and 4920 are each resistors, wherein impedance elements 4910 and 4920 each include a resistance in the range of about 10 kΩ to about 10 MΩ. In another embodiment, impedance elements 4910 and 4920 are each capacitors, wherein impedance elements 4910 and 4920 each include a capacitance in the range of about 100 pF to about 100 nF. Other impedances may also be used to form the voltage divider.

As noted, sensing circuit 400 is configured similar to sensing circuit 200 discussed above with reference to FIG. 2 (i.e., in an absolute capacitance arrangement). In another embodiment, sensing circuit 400 is configured similar to sensing circuit 100 discussed above with reference to FIG. 1 (i.e., in a "transcapacitance" arrangement). In yet another embodiment, sensing circuit 400 is configured similar to sensing circuit 300 discussed above with reference to FIG. 3, in either an absolute capacitance or "transcapacitance" arrangement.

In general, guarding circuit 490 may be implemented in any sensing circuit discussed herein. For example, in various embodiments, guarding circuit 490 is implemented such that guarding circuit 490 is coupled to the waveform generator, and "coupled" to a node between the capacitive elements from which the ratio is being measured.

The introduction of guard circuit 490 changes equations 1-3 relating to the voltage to capacitances $C_1$ and $C_2$. That is, the voltage $V_n$ becomes dependent on the capacitances of the guard coupling $C_g$, labeled guarding electrode 4930. Changes in the guard coupling may also be utilized to detect the proximity of objects to sensing circuit 400.

Figure 5:
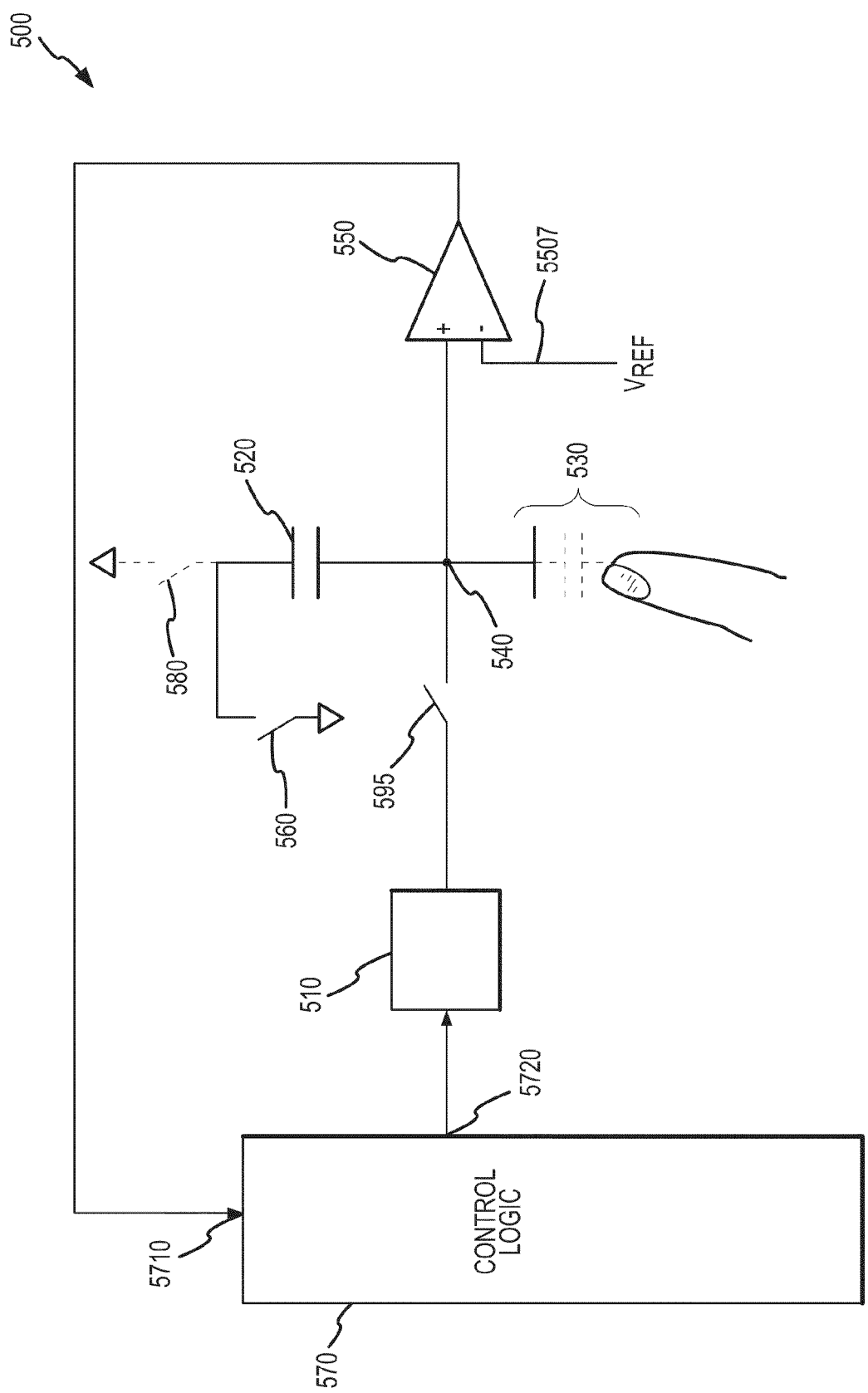
FIG. 5 is a diagram illustrating another embodiment of a sensing circuit for measuring a ratio of capacitances to detect absolute capacitance variations with high side drive and low side comparison.

FIG. 5 is a diagram of another embodiment of a sensing circuit 500 for measuring a ratio of capacitances. As illustrated in FIG. 5, sensing circuit 500 includes waveform generator 510, capacitive elements 520 and 530, comparator 550 coupled to a reference voltage 5507, biasing element 560, and control logic 570 coupled to waveform generator 510 via a control logic output 5720 and to comparator 550 via a control logic input 5710 similar to the various embodiments discussed above. Here, waveform generator 510 is coupled to capacitive element 520 via node 540, and capacitive element 520 is coupled to biasing element 560 and coupled to capacitive element 530 via node 540. Furthermore, comparator 550 is coupled to capacitive element 530 and coupled to capacitive element 520 via node 540. Moreover, sensing circuit 500 includes a switch 595 (e.g., an SPST switch) coupled between waveform generator 510 and node 540.

Similar to above, each of capacitive elements 520 and 530 may have either a fixed capacitance or a variable capacitance. Furthermore, capacitive elements 520 and 530 may have substantially the same capacitance. Moreover, capacitive elements 520 and 530 may be arranged in an absolute capacitance arrangement (as shown in FIG. 5) or arranged in a "transcapacitive" arrangement (not shown).

In exemplary operation, sensing circuit 500 first sets an initial voltage by driving the output voltage of the waveform generator 510 to GND while switches 595 and 560 are closed. This clears any stray charge in sensing circuit 500 and sets the voltage at node 540 to GND.

After the initial voltage is set, sensing circuit 500 opens biasing element 560 and drives an initial voltage $V_{wi}$ into node 540 using waveform generator 510 and charges capacitive element 530. The charge that is stored on capacitive element 530 can be calculated as the initial $V_{wi}$ times the capacitance of capacitive element 330 (where the amount of charge stored on capacitive element 530 can be calculated using the relationship Q=CV, and where Q is the charge stored, C is the capacitance of capacitive element 530, and V is the voltage across capacitive element 530).

Next, sensing circuit 500 shares the charge stored on capacitive element 530 by opening switch 595 and using biasing element 560, which puts capacitive elements 520 and 530 in parallel with each other and causes current to flow between capacitive elements 520 and 530 until the voltage (i.e., $V_{wi}$) at node 540 is equal to $V_{wi} \cdot (C_{530})/(C_{520}+C_{530})$. This $V_{wi}$ can then be compared against the reference voltage using comparator 550. Stray and/or background capacitances may be ignored in this equation, but if significant, may affect the voltage.

The entire process beginning from setting the initial voltage can be repeated to test another voltage value for waveform generator 510, and repetitions can occur until the full range of $V_w$ is tested or as needed to determine which voltage value of $V_w$ would cause the voltage $V_n$ at node 540 to change the state of comparator 550 (which indicates that $V_n$ is approximately $V_{ref}$). Alternately, a process such as successive approximation or the like may be used to find the appropriate $V_w$. Knowledge of such a value of $V_w$ allows calculation of the ratio including $(C_{530})/(C_{520}+C_{530})$ as $V_n/V_{wi}$, where $C_{520}$ is the capacitance of capacitive element 520 and $C_{530}$ is the capacitance of capacitive element 530. If one of the capacitances of capacitive element 120 or 130 is known, then the other one can also be easily calculated.

The ratio including the capacitances can be used to calculate a value for the measurable variable capacitance if the other capacitance values are known, and the value of the measurable variable capacitance used by sensing circuit 500 or an electronic system in communications with sensing circuit 500 to derive input information. In some embodiments, the ratio or fractional change can be used directly to derive information about inputs.

This foregoing example has assumed that everything is referenced to GND, and has ignored non-idealities such as stray capacitance, current leakage, and the like. It is understood that other embodiments (e.g. other references aside from GND, are contemplated). A switch, such as switch 580, is also contemplated to enable sensing circuit 500 to be less sensitive to stray capacitances coupled to biasing element 560.

Figure 6:
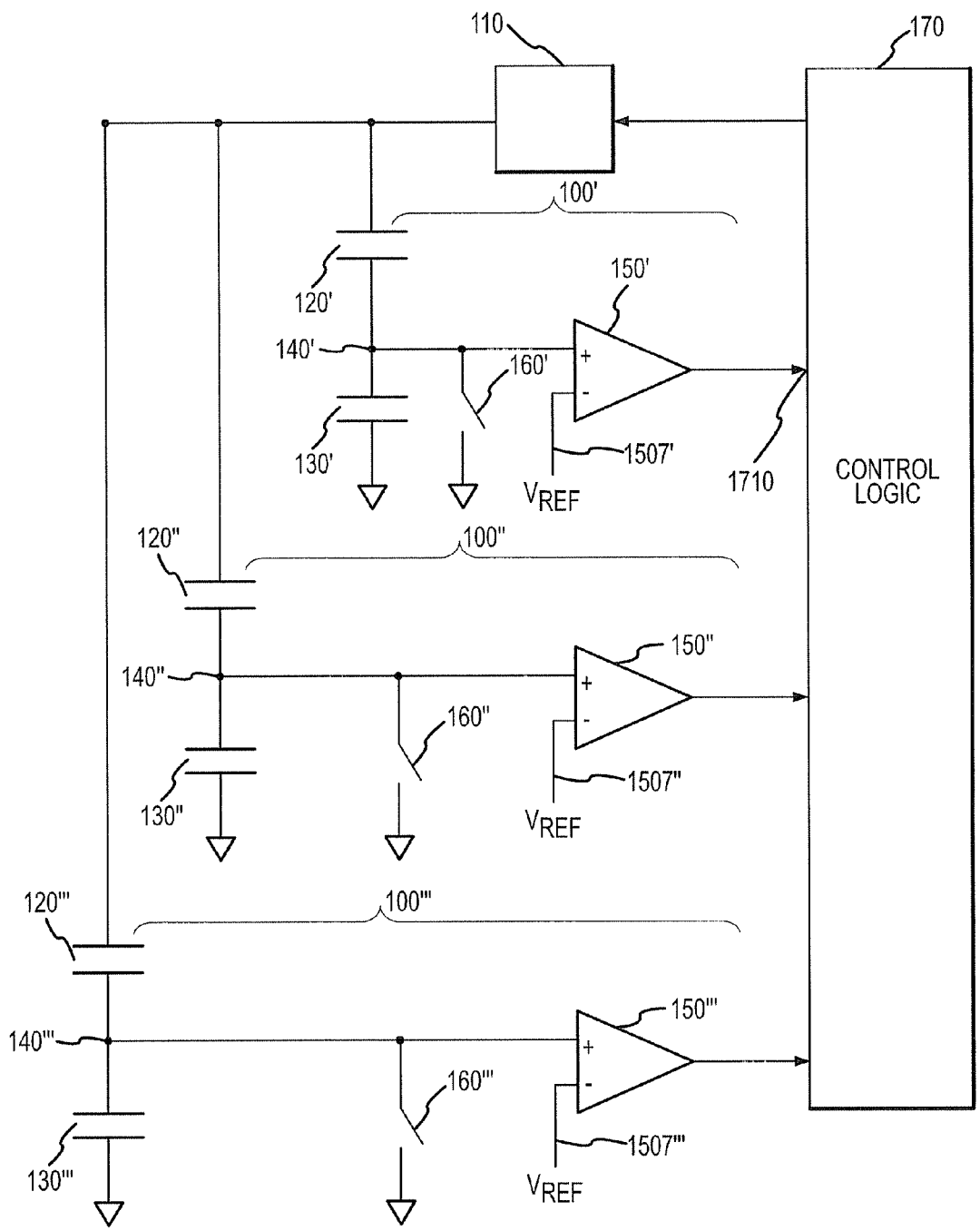
FIG. 6 is a diagram of a system for measuring a plurality of ratios of capacitances with a plurality of sensing circuits of the system.

FIG. 6 is a diagram of a system 600 for measuring a plurality of ratios of capacitances of a plurality of sensing circuits of system 600. As illustrated, system 600 includes control logic 170 coupled to waveform generator 110 similar to sensing circuit 100 discussed above. Moreover, system 600 includes sensing circuit portion 100', sensing circuit portion 100", and sensing circuit portion 100'" that are portions of the sensing circuit 100 shown in FIG. 1. These portions 100', 100", and 100'" share and are coupled to waveform generator 110 and control logic 170.

Each of sensing circuit portions 100', 100", and 100'" includes at least one sensor electrode as part of a capacitive element having a variable capacitance $C_X$ (e.g., capacitive elements 120' and/or 130', 120" and/or 130'", 120'" and/or 130'") similar to various embodiments of sensing circuit 100 discussed above. The sensor electrodes can be disposed in an appropriate layout for sensing the desired parameter(s). For example, the sensor electrodes can be laid out as non-overlapping circular electrodes separated by sufficient distance such that a conductive object can interact with the sensor electrodes separately; these sensor electrodes may be used independently as capacitive buttons for an electronic system. As another example, the sensor electrodes can be laid out as rectangular electrodes side-by-side in a strip format, and the information from the sensing circuit portions 100', 100", and 100'" used to provide positional information along one axis. As a further example, the sensor electrodes can be laid out in a matrix or other 2D manner, or special electrode shapes used, to enable the system 600 to provide positional information along two or more axes. Furthermore, each of sensing circuit portions 100', 100", and 100'" includes a respective biasing element (e.g., biasing elements 160', 160", and 160''') coupled to its respective comparator and capacitive elements (via nodes 140', 140", and 140'''). In addition, each of sensing circuit portions 100', 100", and 100''' includes a respective comparator (e.g., comparators 150', 150", and 150''') having a reference voltage (e.g., reference voltages 1507', 1507", and 1507''') coupled to control logic 170 and the capacitive elements similar to various embodiments of sensing circuit 100 discussed above.

Furthermore, control logic 170 is suitably configured to interpolate the signals output by each of comparators 150', 150", and 150''' to determine positional information about the conductive object relative to the sensor electrodes of sensing circuit portions 100', 100", and 100'''. In other words, by proper processing information about the capacitance ratios obtained from sensing circuits 100', 100", and 100''', control logic 170 is capable of determining positional information such as the location or motion of the conductive object. The processing can be quite simple. For example, system 600 can determine which sensor electrode a conductive object is most proximately located by determining which of the sensing circuit portions 100', 100", and 100''' had the largest change in capacitance. For example, if the capacitive element having variable capacitance $C_X''$ has a larger change capacitance than the capacitive element having variable capacitance $C_X'$, but the capacitive element having variable capacitance $C_X'''$ has a larger change capacitance than the capacitive element having variable capacitance $C_X''$, control logic 170 of this example will determine that the conductive object is located closer to capacitive element 130''' than to either of capacitive elements 130' and 130". More complex sensor electrode patterns and interpolation algorithms are easily found in literature and patents in the field of capacitance proximity sensing, and are contemplated here.

In one embodiment, reference voltages 1507', 1507", and 1507''' are substantially the same voltage. Reference voltages 1507', 1507", and 1507''' are likely substantially similar if one single microcontroller is used to implement comparators 150', 150", and 150'''. In another embodiment, at least two of reference voltages 1507', 1507", and 1507''' include substantially different voltages. In yet another embodiment, each of reference voltages 1507', 1507", and 1507''' include substantially different voltages. In almost all cases, the reference voltages 1507', 1507", and 1507''' will have slight differences due to considerations such as manufacturing and design tolerances, and these differences will not be substantial.

In operation, each of sensing circuit portions 100', 100", and 100''' individually functions in a manner similar to the various embodiments of sensing circuit 100 discussed above. Notably, although FIG. 6 illustrates system 600 including three sensing circuits, various embodiments of system 600 contemplate that system 600 may include any number of sensing circuits greater than zero. Accordingly, system 600 may include an infinite number of configurations.

In another exemplary embodiment of system 600, system 600 has only two sensing circuit portions 100' and 100" with fixed capacitances, sensor electrodes, and variable capacitances configured to change in capacitance in response to input near the sensor electrodes. The third circuit portion 100''', although similar to the sensing circuit portions 100' and 100" when represented in circuit diagram form, has only fixed capacitances that are configured to change insubstantially in response to input near the fixed capacitances. The circuit portion 100''' is driven the same way as the sensing portions 100; and 100''' during operation in this embodiment, and functions as a reference for system 600. The changes associated with circuit portion 100''' can be used to reject noise more reliably. Notably, when configured similar to sensing circuit 400, system 600 may also function as a low impedance guard for other sensing electrodes.

As illustrated, sensing system 600 includes waveform generator 110, sensing circuit portions 100', 100", and 100''', and control logic 170, wherein each of sensing circuit portions 100', 100", and 100''' are coupled to shared waveform generator 110 and control logic 170 to form circuit portions similar to sensing circuit 100. In alternate embodiments, sensing system 600 can be adapted to implement sensing circuits, either in a transcapacitive arrangement or an absolute capacitance arrangement, analogous to sensing circuit 200 shown in FIG. 2, sensing circuit 300 shown in FIG. 3, sensing circuit 400 shown in FIG. 4, or sensing circuit 500 shown in FIG. 5 to enable alternate multiple-sensor electrode systems. In a preferred embodiment, waveform generator 110 sweeps through a range of voltages until each comparator on a measured sensor (e.g., sensor 100') changes state.

Figure 7:
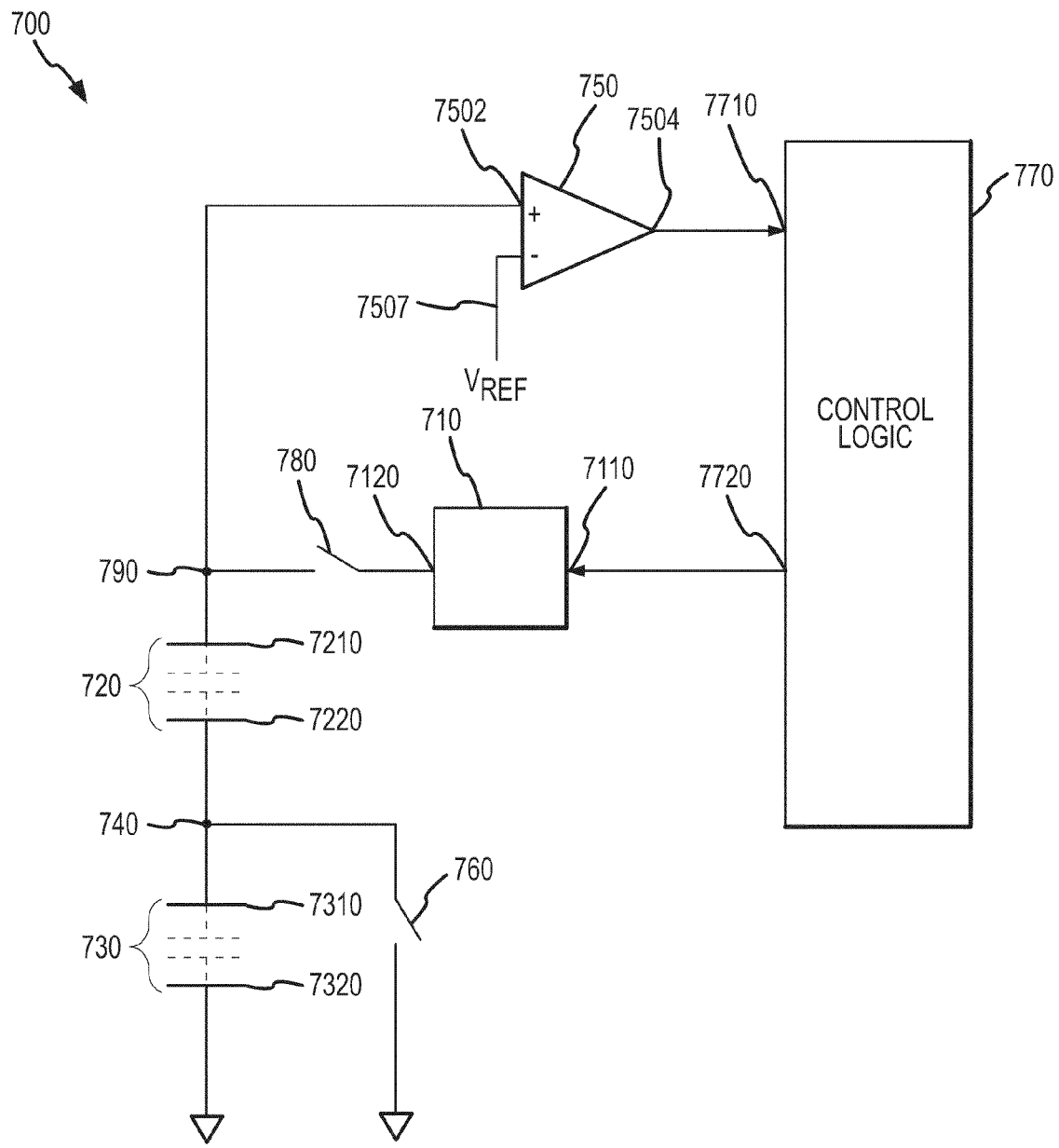
FIG. 7 is a diagram illustrating embodiments of a sensing circuit for measuring a ratio of capacitances with high side drive and high side comparison.

FIG. 7 is a diagram illustrating one embodiment of a sensing circuit 700 for measuring a ratio of capacitances. In one embodiment, sensing circuit 700 includes a waveform generator 710 having a waveform generator input 7110, a waveform generator output 7120 and is configured to operate in a manner similar to the various embodiments of waveform generators discussed above.

Sensing circuit 700 includes a capacitive element 720 having a capacitive element electrode 7210 and a capacitive element electrode 7220. Moreover, sensing circuit 700 includes a capacitive element 730 having a capacitive element electrode 7310 and a capacitive element electrode 7320. In one embodiment, capacitive element 730 is coupled in series with capacitive element 720 by capacitive element electrode 7310 and capacitive element electrode 7220 via a node 740.

Capacitive elements 720 and 730, in one embodiment, have substantially the same capacitance, although capacitive elements 720 and 730 may have different capacitances. Furthermore, capacitive elements 720 and 730 each have a capacitance in the range of about 1 pF to about 100 pF. In one exemplary embodiment, capacitive elements 720 and 730 each have a capacitance of about 10 pF.

Capacitive elements 720 and 730, in one exemplary embodiment, each have a variable capacitance. In another embodiment, capacitive element 720 has a fixed capacitance and capacitive element 730 has a variable capacitance $C_X$. In yet another embodiment, capacitive element 730 has a fixed capacitance and capacitive element 720 has a variable capacitance $C_X$.

Sensing circuit 700 includes a comparator 750 having a comparator input 7502, a comparator output 7504, a reference voltage 7507 (e.g., in the range of about −5 volts to about 5 volts), and is configured to operate in a manner similar to the various embodiments of comparators discussed above. As illustrated, comparator input 7502 is coupled to both capacitive element electrode 7210 and waveform generator output 7120 via a node 790.

In addition, sensing circuit 700 includes a biasing element 760 coupled to capacitive element electrode 7220 and capacitive element electrode 7310 to "clear" any residual charge on capacitive element 730 prior to waveform generator 710 transmitting additional charge to capacitive elements 720 and 730. Furthermore, biasing element 760 may be configured to be used each time $V_w$ changes. Moreover, biasing element 760 may be configured similar to the various embodiments of biasing elements discussed above.

Sensing circuit 700 includes control logic 770 including a control logic input 7710 and a control logic output 7720, wherein control logic 770 is coupled to waveform generator 710 via control logic output 7720 and waveform generator input 7110, and coupled to comparator 750 via control logic input 7710 and comparator output 7504. Control logic 770 may be configured and operate in a manner similar to control logic 170 discussed above.

In addition, sensing circuit 700 includes a switch 780 coupled to node 790 and waveform generator output 7120 of waveform generator 710. In one embodiment, switch 780 is a SPST switch. In another embodiment switch 780 is configured to open and close based upon the timing of control logic 770 concerning when the voltage waveform generator is generating a voltage for capacitive elements 720 and 730 (when switch 780 should be closed) and when the comparator 750 compares the voltage at node 790 with the reference voltage 7507 to measure the capacitive sensor element ration (when switch 780 should be open).

Similar to above, any combination of waveform generator 710, comparator 750, control logic 770, and biasing element 760 can be implemented using one or more microcontrollers, and they may comprise at least a portion of a microcontroller. In addition, switch 780 may also be implemented using a microcontroller, such as via a digital output, a multiplexer, or a DAC of a microcontroller. Driving a voltage would affect the closing of switch 780 and holding the digital output or the DAC to high impedance would affect the opening of switch 780.

The following example may be helpful in understanding the operation of sensing circuit 700. In this example, capacitive element 720 has a fixed capacitance ($C_{720}$) and capacitive element 730 has variable capacitance $C_X$ (or also termed $C_{730}$), wherein $C_{720}$ is selected to be approximate to the average expected $C_{730}$. Furthermore, waveform generator 710 is a DAC outputting a variable voltage ($V_w$) between power supply voltages of ground and $V_{dd}$ (e.g., 10 volts). Moreover, reference voltage 7507 is set to slightly less than $V_{dd}/4$ (2.5 volts in this example) and biasing element 760 is an SPST switch.

In operation, switch 780 is opened and biasing element 760 is used to discharge any stray current that may be present in sensing circuit 700 and set the voltage across capacitive element 730 to a predetermined value. Next, biasing element 760 may be opened and switch 780 is closed such that waveform generator 710 can output $V_w$ to node 790. At this point, the capacitive elements 720 and 730 act as a voltage divider, and divide the voltage $V_w$ driven onto node 790 between them. Subsequently, switch 780 is opened to disconnect node 790 from the driven voltage of $V_w$ and biasing element 760 is used to drive the voltage $V_n$ at node 740 to ground. This lowers the voltage at node 790 by the voltage across capacitive element 730 such that the voltage at node 790 can be represented as an equation including a ratio of capacitance $C_{720}$ and $C_{730}$ (this equation ignores noise, offsets, non-idealities, stray capacitances, etc.):

$$V_n = V_w (C_{730}/(C_{720}+C_{730})). \quad \text{(equation 4)}$$

Comparator 750 then compares the voltage at node 790 with reference voltage 7507 to measure the ratio of capacitances. If the output signal of comparator 750 has not changed state, then biasing element 760 is opened and switch 780 closed another time to allow voltage waveform generator 710 to output another value of voltage $V_w$. Switch 780 is then again opened and biasing element 760 is again closed to generate another voltage $V_n$ at node 790 for comparing with reference voltage 7507 by comparator 750. This process repeats until the output signal of comparator 750 changes state. In various embodiments the process may be continued until the swing in voltage $V_w$ that causes node 790 to swing closest to reference voltage 7507 that changes the state of comparator 750.

In this example, since $V_w$ changes from GND to $V_{dd}$, the process would repeat until $V_w$ has spanned its entire range from GND to $V_{dd}$ or until the voltage across capacitive element 730 ($C_{730}$) is less than reference voltage 7507 such that the residual voltage at node 790 would be greater than reference voltage 7507 and comparator 750 trips. (If $V_w$ changes from $V_{dd}$ to GND, then the reverse would be the case). In this example, $V_w$ is output in discrete steps at voltages between ground (i.e., 0 volts) and $V_{dd}$ (i.e., 10 volts), with a substantially constant voltage output for each opening and closing of switch 780 and biasing element 760. Unlike sensing circuit 100 of FIG. 1 where the biasing element 160 need only clear stray current as needed, the biasing element 760 of sensing circuit 700 should clear the current across capacitive element 720 and/or 730 each time a different $V_w$ is used to change the voltage at node 790.

In one embodiment, waveform generator 710 generates differing amounts of voltage on capacitive elements 720 and 730, and control logic 770 determines whether the voltage is greater than or less than a threshold voltage utilizing a process known as "successive approximation." The resolution, in one exemplary embodiment, is a 12 bit resolution, although other resolutions are contemplated by the invention.

Figure 7A:
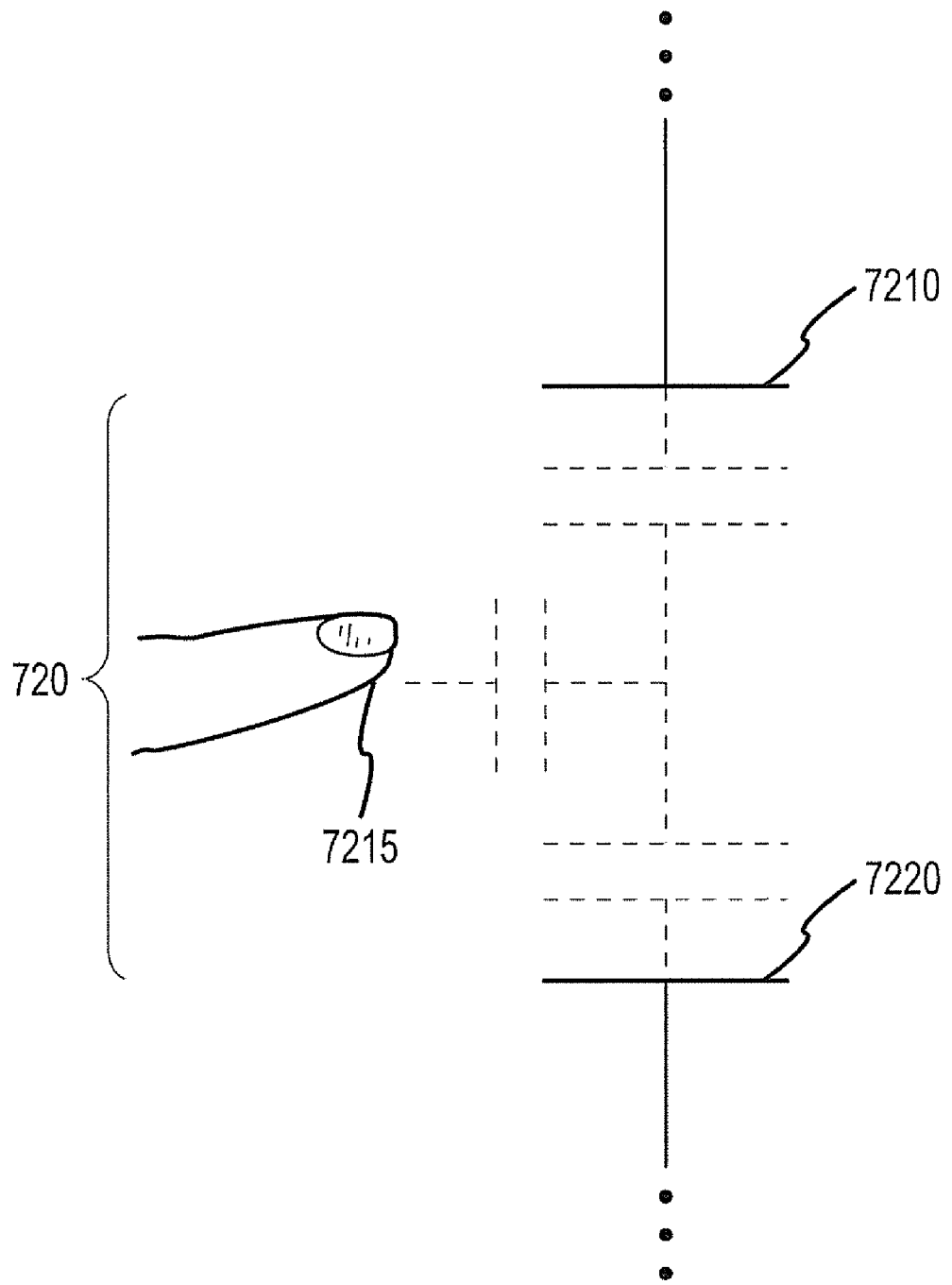
FIG. 7A is a diagram illustrating a model of the transcapacitive effect of a finger on a capacitive coupling.

Notably, the above example describes capacitive element 720 as having a fixed capacitance and capacitive element 730 as having a variable capacitance $C_X$ in an arrangement known as "absolute capacitance." It should be noted that sensing circuit 700 works in a similar manner when capacitive element 730 has a fixed capacitance and capacitive element 720 has a variable capacitance $C_X$, known as "transcapacitance," or when both capacitive element 720 and capacitive element 730 have variable capacitances $C_{X7}$ and $C_{X2}$, respectively. In accordance with one transcapacitance embodiment, the coupling capacitance through capacitive element 720 via electrodes 7210 and 7220 is reduced by the presence of another electrode 7215, which could be, for example, a finger as shown in FIG. 7A (which is similar to FIG. 1A discussed above). In another transcapacitance embodiment, a high dielectric stylus may be utilized to increase the coupling between electrodes 7210 and 7220.

Figure 8:
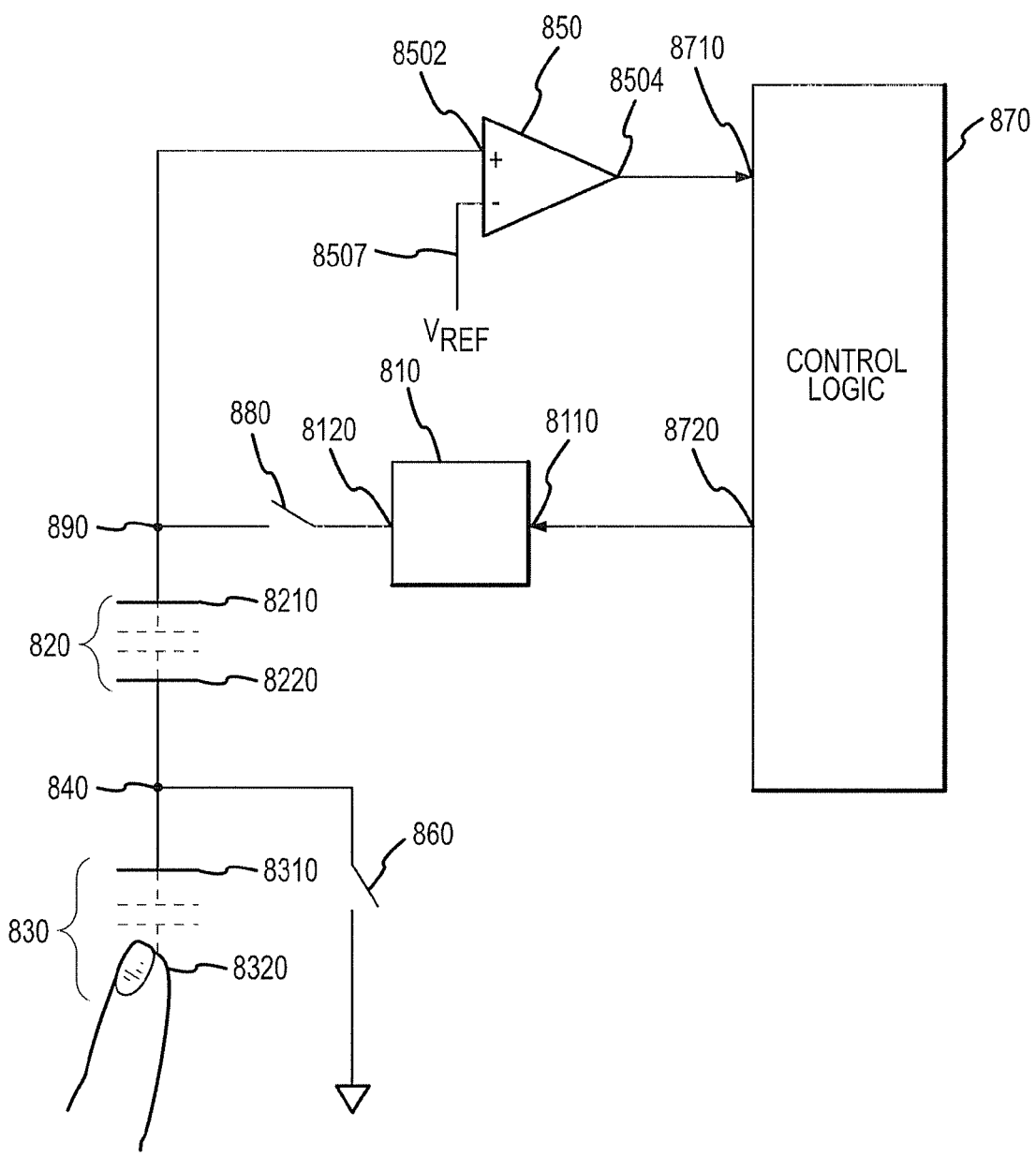
FIG. 8 is a diagram illustrating another embodiment of a sensing circuit for measuring a ratio of capacitances to detect absolute capacitance variations with high side drive and high side comparison.

FIG. 8 is a diagram of another embodiment of a sensing circuit 800 for measuring a ratio of capacitances that can be used to enable sensing circuit 800 to detect positional information about an object (not shown) proximate to sensor electrode(s) of sensing circuit 200 in an absolute capacitance arrangement. In one embodiment, sensing circuit 800 includes a waveform generator 810 coupled to a control logic 870 and a switch 880 similar to waveform generator 710 coupled to control logic 770 and switch 780 discussed above. Furthermore, sensing circuit 800 includes a comparator 850 having a reference voltage 8507 coupled to control logic 870 similar to comparator 750 coupled to control logic 770 discussed above. Moreover, waveform generator 810, control logic 870, comparator 850, and switch 880 are each suitably configured similar to the various embodiments of waveform generator 710, control logic 770, comparator 750, and switch 780 discussed above, respectively.

In one embodiment, sensing circuit 800 includes a capacitive element 820 coupled to waveform generator 810 (via switch 880) and comparator 850 similar to capacitive element 720 coupled to waveform generator 710 and comparator 750 discussed above. Moreover, capacitive element 820 includes capacitive element electrodes 8210 and 8220 and is suitably configured similar to the various embodiments of capacitive element 820 discussed above.

Furthermore, sensing circuit 800 includes a capacitive element 830 coupled to capacitive element 820 (via capacitive element electrode 8220) and a biasing element 860, wherein biasing element 860 may be suitably configured similar to the various embodiments of biasing element 760 discussed above. In one embodiment, capacitive element 830 is implemented with a sensor electrode 8310, and capacitive element 830 has a variable capacitance $C_X$ that is configured to be determined, at least in part, by the proximity of a conductive object near sensor electrode 8310.

In one embodiment, capacitive element 830 includes a capacitance in the range of about 1 pF to about 100 pF when an external conductive object (e.g., human finger, stylus, etc.) is not located proximate to sensor electrode 8310. Furthermore, capacitive element 830 includes a capacitance in the range of about 2 pF to about 101 pF when an external conductive object is located proximate to sensor electrode 8310. For example, capacitive element 830 is suitably configured to include a first capacitance when a conductive object is not within a threshold proximity to sensor electrode 8310 and include a second, different capacitance when a conductive object is within a threshold proximity to sensor electrode 8310. As such, the conductive object essentially forms a second capacitive element electrode when the conductive object is within the threshold proximity to sensor electrode 8310. Accordingly, FIG. 8 illustrates that, for example, a human finger may become capacitive element electrode 8320 to increase the capacitance of capacitive element 830 when the human finger is within a threshold proximity to sensor electrode 8310, which is represented by the dotted lines. Moreover, other conductive objects such as, for example, a stylus or other conductive object may become capacitive element electrode 8320 when sufficiently close to sensor electrode 8310.

The operation of sensing circuit 800 is similar to the operation of sensing circuit 700 with respect to capacitive elements 820 and 830, comparator 850, switch 880, and biasing element 860.

Figure 9:
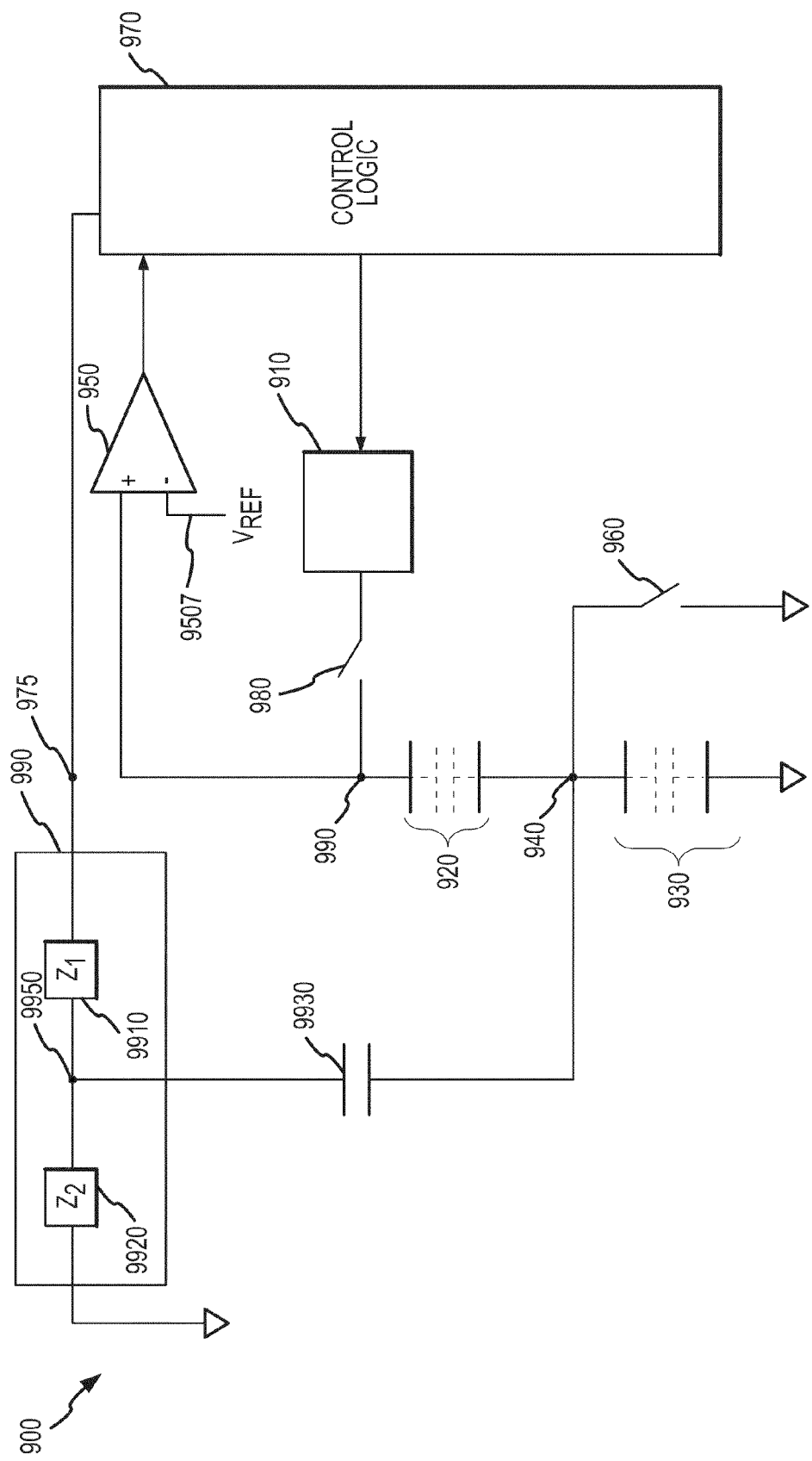
FIG. 9 is a diagram illustrating yet another embodiment of a sensing circuit for measuring a ratio of capacitances to detect guarded absolute capacitance variations with high side drive and high side comparison.

FIG. 9 is a diagram of yet another embodiment of a sensing circuit 900 for measuring a ratio of capacitances including a guarding circuit 990. Sensing circuit 900 includes a waveform generator 910, capacitive elements 920 and 930, a node 940, a comparator 950, a biasing element 960, control logic 970, a switch 980, and a node 990 similar to waveform generator 810, capacitive elements 820 and 830, node 840, comparator 850, biasing element 860, control logic 870, switch 880, and node 890 discussed above with reference to FIG. 8.

Guarding circuit 990, in one embodiment, includes a plurality of impedance elements (e.g., impedance element 9910 and impedance element 9920), wherein impedance elements 9910 and 9920 are coupled to each other such that they form a voltage divider when driven by a voltage applied at a node 975 and divides the voltage applied at node 975 to produce the guard signal at guard signal node 9950. Guarding circuit 990 is coupled to the rest of sensing circuit 900 via node 975 through control logic 970. The voltage may be applied by a digital output of control logic 970, by voltage generator 910, by an external DAC, or the like. In an embodiment, guard signal node 9950 is coupled to a guarding electrode 9930 located proximate to sensor electrode(s) of capacitive elements 920 and/or 930 and drives a relatively low impedance guard signal onto guarding electrode 9930. Guarding electrode 9930 is configured to guard the sensor electrode(s) of capacitive elements 920 and/or 930 from noise and changes in charge due to stray currents, and thus can be modeled as being capacitively coupled through a guarded capacitance 9930 to node 940.

In one embodiment, impedance elements 9910 and 9920 are each resistors, wherein impedance elements 9910 and 9920 each include a resistance in the range of about 10 kΩ to about 10 MΩ. In another embodiment, impedance elements 9910 and 9920 are each capacitors, wherein impedance elements 9910 and 9920 each include a capacitance in the range of about 100 pF to about 100 nF. Other impedances may also be used to form the voltage divider.

As noted, sensing circuit 900 is configured similar to sensing circuit 800 discussed above with reference to FIG. 8 (i.e., in an absolute capacitance arrangement). In another embodiment, sensing circuit 900 is configured similar to sensing circuit 700 discussed above with reference to FIG. 7 (i.e., in a transcapacitance arrangement).

In general, guarding circuit 990 may be implemented in any sensing circuit discussed herein. For example, in various embodiments, guarding circuit 990 is implemented such that guarding circuit 990 is coupled to the comparator, and coupled to a node between the capacitive elements from which the ratio is being measured. In one embodiment (not shown), the voltage on node 9950 may be measured by a comparator similar to the sensing channels to act as a combined reference channel and guarding electrode.

Figure 10:
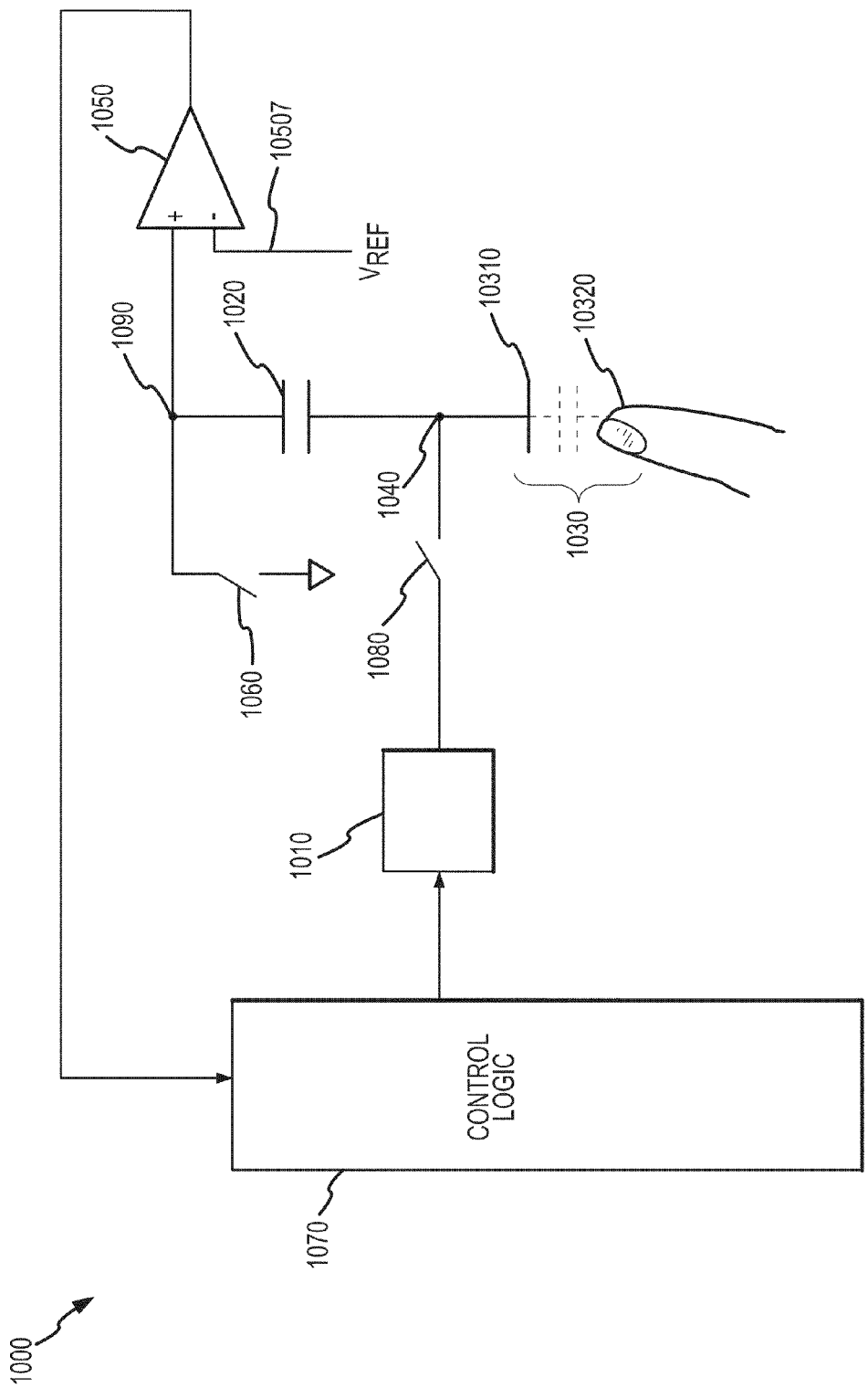
FIG. 10 is a diagram illustrating still another embodiment of a sensing circuit for measuring a ratio of capacitances to detect absolute capacitance variations with low side drive and high side comparison.

FIG. 10 is a diagram of still another embodiment of a sensing circuit 1000 for measuring a ratio of capacitances. Sensing circuit 1000 includes a waveform generator 1010 coupled to a switch 1080, wherein waveform generator 1010 and switch 1080 are configured similar to the various embodiments of waveform generators and switches discussed above, respectively. Furthermore, switch 1080 is coupled to capacitive elements 1020 and 1030 via a node 1040, wherein capacitive elements 1020 and 1030 are configured similar to various embodiments of capacitive elements in an absolute capacitance arrangement discussed above. Moreover, capacitive element 1020 is coupled to a comparator 1050 and a biasing element 1060 via a node 1090, wherein comparator 1050 is coupled to control logic 1070 similar to the various embodiments discussed above.

Similar to above, capacitive elements 1020 and 1030 may have a fixed capacitance or a variable capacitance. Moreover, in some embodiments, capacitive elements 1020 and 1030 may have substantially the same capacitance.

In exemplary operation, sensing circuit 1000 first sets an initial voltage by following three steps. In the first step of setting an initial voltage, sensing circuit 1000 drives the output voltage of waveform generator 1010 to GND (i.e., zero volts) while switch 1080 is closed and using biasing element 1060. This clears any stray charge across capacitive element 1020 and sets the voltages at nodes 1090 and 1040 to GND. In the second step of setting the initial voltage, sensing circuit 1000 opens switch 1060 and drives the output voltage of waveform generator 1010 to a known voltage (e.g. $V_{dd}$). This places a charge on capacitive element 1030 that can be calculated using the relationship electrical Q=CV. In this case, the charge stored on capacitive element 1030 is equal to the known voltage times the capacitance of capacitive element 1030 (e.g. $Q_{1030}=V_{dd} \cdot C_{1030}$). In the third step of setting the initial voltage, sensing circuit 1000 opens switch 1080 and uses biasing element 1060 to put capacitive elements 1030 and 1020 in parallel, such that the voltage at node 1090 is GND and the voltage at node 1040 is defined by the sharing of the charge on capacitive element 1030 between the capacitive elements 1030 and 1020. Ignoring stray capacitances, the voltage $V_n$ at node 1040 should settle at roughly $V_{n\_initial}=V_{dd}\cdot(C_{1030})/(C_{1020}+C_{1030})$. This three-step process then sets the initial voltage at node 1090 (GND) as an offset in relation to the voltage at node 1040. After this setting of the initial voltage, sensing circuit 1000 then opens switch 1060, closes switch 1080, and drives the output signal of waveform generator 1010 to the varying waveform $V_w$ desired (which can be a full range of variation, since the system does not need to be reset to the initial voltage(s) between different values of $V_w$). The values of $V_w$ cause an offset voltage waveform to appear at node 1090 (as defined by the initial voltage difference), and the voltage at node 1090 can be compared against the reference voltage using comparator 1050.

The values of $V_w$ that cause comparator 1050 to change state enables calculation of the voltage at node 1090, the voltage across capacitive element 1020, and the ratio including the capacitance of capacitive elements 1020 and 1030 as $(C_{1030})/(C_{1020}+C_{1030})$, where $C_{1020}$ is the capacitance of capacitive element 1020 and $C_{1030}$ is the capacitance of capacitive element 1030. If one of the capacitances of capacitive element 1020 or 1030 is known, then the other one can also be easily calculated.

Notably, although sensing circuit 1000 is illustrated as having an absolute capacitance arrangement, various embodiments contemplate that sensing circuit 1000 may be implemented as having a transcapacitive arrangement. Accordingly, in these transcapacitive embodiments, capacitive element 1020 will include capacitive element electrodes 10210 and 10220 similar to electrodes 1210, 1215, and 1220 in FIG. 1A.

The ratio including the capacitances can be used to calculate a value for the measurable variable capacitance if the other capacitance values are known, and the value of the measurable variable capacitance used by sensing circuit 1000 or an electronic system in communications with sensing circuit 1000 to derive input information. In some embodiments, the ratio can be used directly to derive information about inputs.

This foregoing example has assumed that everything is referenced to GND, and has ignored non-idealities such as stray capacitance, current leakage, and the like. It is understood that other embodiments (e.g. other references aside from GND, are contemplated), and that the effects of non-idealities, stray capacitances, and the like may be tolerated.

Figure 11:
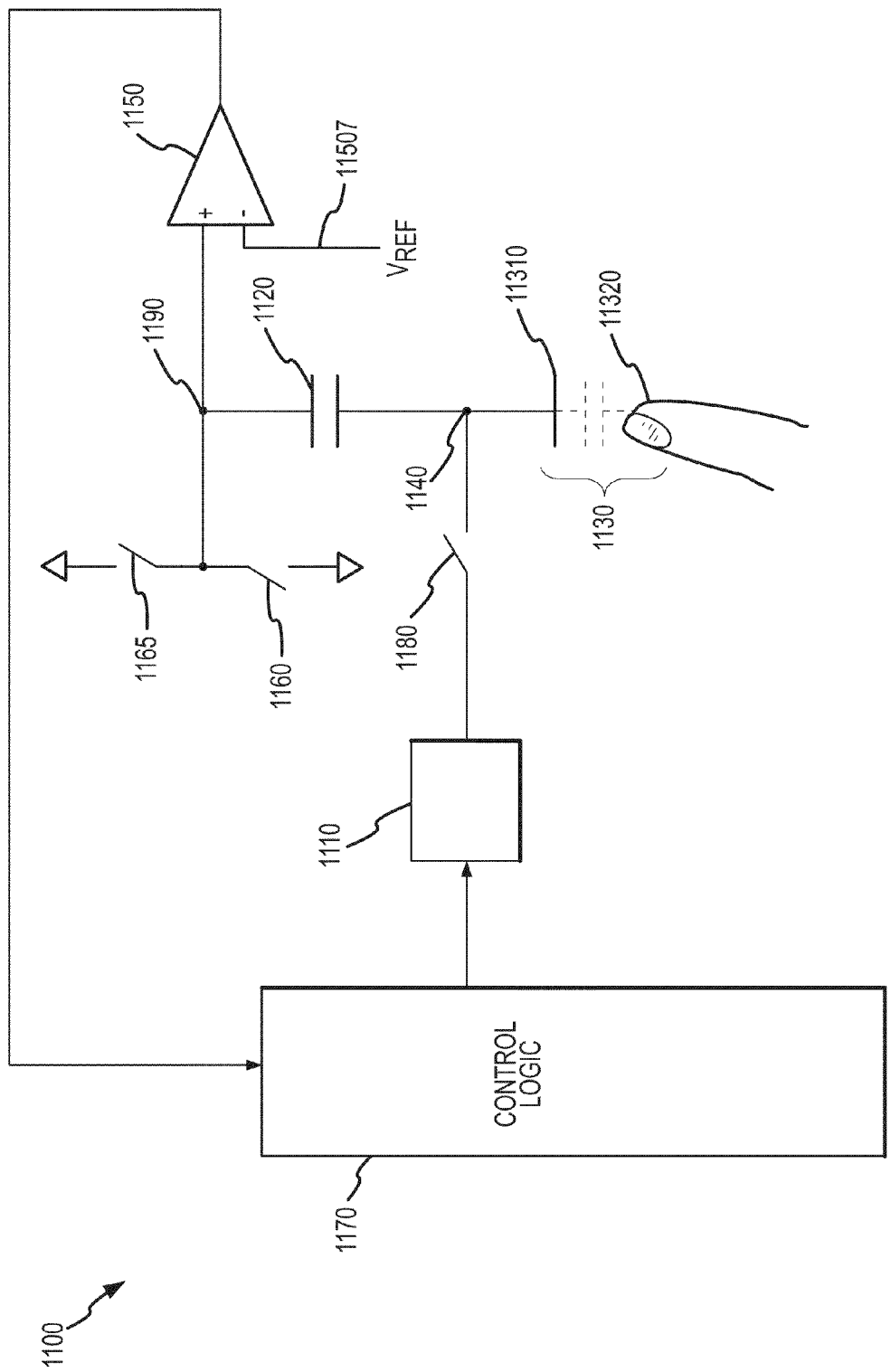
FIG. 11 is a diagram illustrating another embodiment of a sensing circuit for measuring a ratio of capacitances to detect differential absolute capacitance variations with high side drive and high side comparison.

FIG. 11 is a diagram of another embodiment of a sensing circuit 1100 for measuring a ratio of capacitances. Sensing circuit 1100 includes a waveform generator 1110 coupled to a switch 1180, wherein waveform generator 1110 and switch 1180 are configured similar to the various embodiments of waveform generators and switches discussed above, respectively. Furthermore, switch 1180 is coupled to capacitive elements 1120 and 1130 via a node 1140, wherein capacitive elements 1120 and 1130 are configured similar to various embodiments of capacitive elements in an absolute capacitance arrangement discussed above. Moreover, capacitive element 1120 is coupled to a comparator 1150, a biasing element 1160, and a biasing element 1165 via a node 1190, wherein comparator 1150 is also coupled to control logic 1170 similar to the various embodiments discussed above.

Similar to above, capacitive elements 1120 and 1130 may have either a fixed capacitance or a variable capacitance. In some embodiments, capacitive elements 1020 and 1030 may have substantially the same capacitance.

In exemplary operation, sensing circuit 1100 sets an initial voltage using a two step process. In the first step of setting the initial voltage, the output voltage of waveform generator 1110 is driven to GND while switch 1160 and switch 1180 are closed. This sets the voltage at nodes 1190 and 1140 to GND, and clears any stray charge from the sensing circuit 1100. In the second step of setting the initial voltage, switches 1160 and 1180 are opened, and switch 1165 is closed to bring the voltage at node 1190 to the voltage coupled in by switch 1165 (e.g. $V_{dd}$). At this time, the voltage at node 1140 ($V_n$) is determined by the voltage divider formed by capacitive elements 1120 and 1130, which divides the voltage at node 1140 such that $V_{n\_initial}=V_{1190}\cdot(C_{1120})/(C_{1120}+C_{1130}))$ where $C_{1120}$ is the capacitance of capacitive element 1120, $C_{1130}$ is the capacitance of capacitive element 1130, and $V_{1190}$ is the voltage at node 1190. After these steps set the initial voltage, sensing circuit 1100 then opens switch 1165, closes switch 1180, and uses waveform generator 1110 to provide the desired $V_w$ waveform (to find the voltage across capacitive element 1120 since the system does not need to be reset to the initial voltage(s) between different values of $V_w$). The varying $V_w$ values cause the voltage at node 1190 to change as defined by the initial voltage difference, and the voltage at node 1190 can be compared against the reference voltage using comparator 1150.

The values of $V_w$ that cause the comparator to change state enables calculation of the voltage at node 1190 and the ratio including capacitances of capacitive elements 1120 and 1130. If one of the capacitances of capacitive element 1120 or 1130 is known, then the other one can also be easily calculated.

Notably, although sensing circuit 1100 is illustrated as having an absolute capacitance arrangement, various embodiments contemplate that sensing circuit 1100 may be implemented as having a transcapacitance arrangement. Accordingly, in these embodiments capacitive element 1120 will include capacitive element electrodes similar to electrodes 1210, 1215, and 1220 in FIG. 1A.

The ratio including the capacitances can be used to calculate a value for the measurable variable capacitance if the other capacitance values are known, and the value of the measurable variable capacitance used by sensing circuit 1100 or an electronic system in communications with sensing circuit 1100 to derive input information. In some embodiments, the ratio can be used directly to derive information about inputs.

This foregoing example has assumed that everything is referenced to GND, and has ignored non-idealities such as stray capacitance, current leakage, and the like. It is understood that other embodiments (e.g. other references aside from GND) are contemplated.

Figure 12:
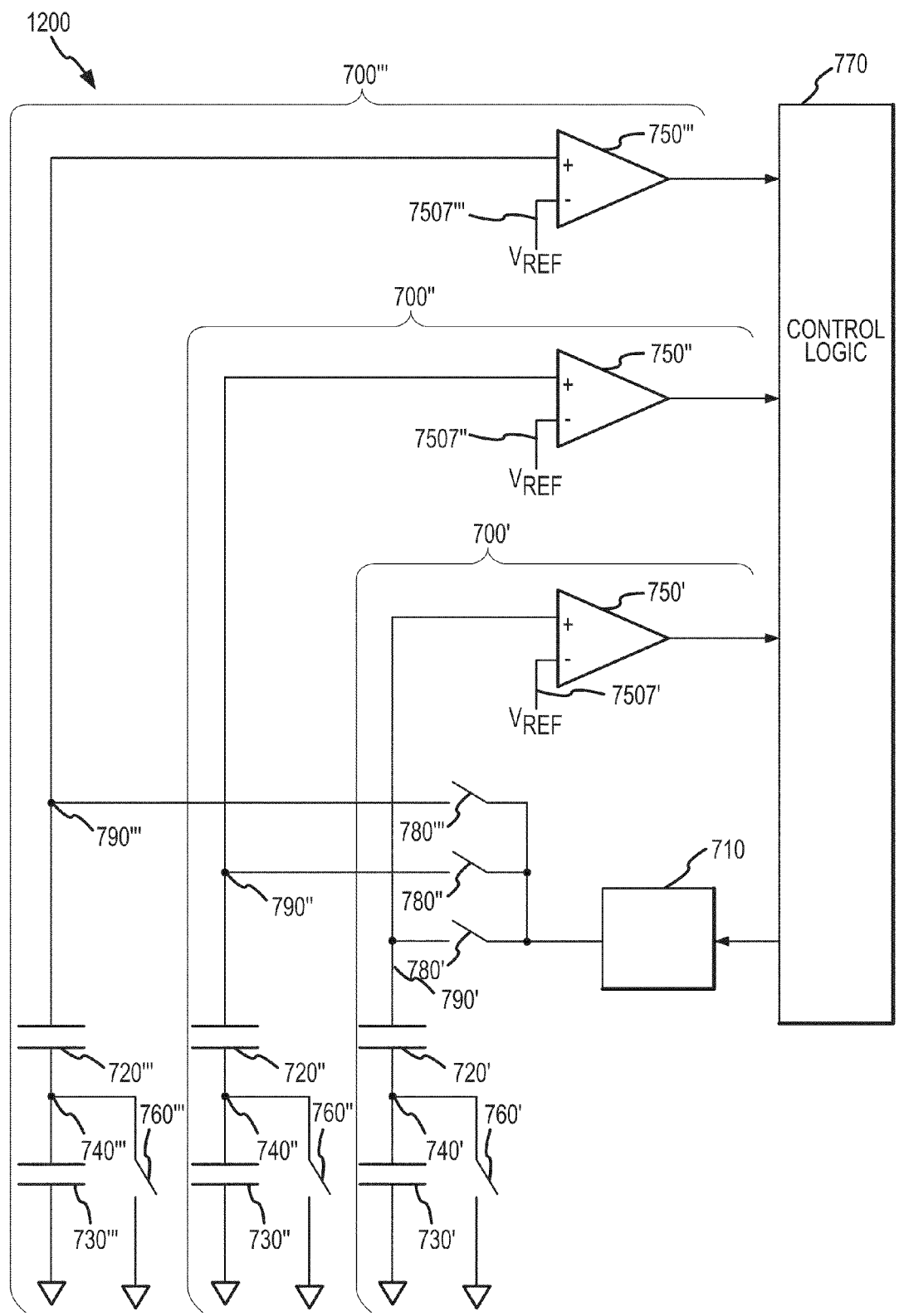
FIG. 12 is a diagram of another system for measuring a plurality of ratios of capacitances with a plurality of sensing circuits of the system.

FIG. 12 is a diagram of a system 1200 for measuring a plurality of ratios of capacitances. As illustrated, system 1200 includes shared control logic 770 coupled to waveform generator 710 similar to sensing circuit 700 discussed above. Furthermore, system 1200 includes sensing circuit portion 700', sensing circuit portion 700", and sensing circuit portion 700''' coupled to shared waveform generator 710. Moreover, each of sensing circuit portion 700', sensing circuit portion 700", and sensing circuit portion 700''' is selectively coupled to waveform generator 710 via a switch (e.g., switch 780', switch 780", and switch 780''', respectively).

Each of sensing circuit portions 700', 700", and 700''' includes at least one sensor electrode as part of a variable capacitive element having variable capacitance $C_X$ (e.g., capacitive elements 720' and/or 730', 720" and/or 730''', 720''' and/or 730''') similar to various embodiments of sensing circuit 700 discussed above. The sensor electrodes can be disposed in an appropriate layout for sensing the desired information. For example, the sensor electrodes can be laid out as non-overlapping circular electrodes separated by sufficient distance such that an object can interact with the sensor electrodes separately; these sensor electrodes may be used independently as capacitive buttons for an electronic system. As another example, the sensor electrodes can be laid out as rectangular electrodes side-by-side in a strip format, and the information from the sensing circuit portions 700', 700", and 700''' used to provide positional information along one axis. As a further example, the sensor electrodes can be laid out in a matrix or other 2D manner, or special electrode shapes used, to enable system 1200 to provide positional information along two or more axes. Furthermore, each of sensing circuit portions 700', 700", and 700''' includes a respective biasing element (e.g., biasing elements 760', 760", and 760''') coupled to its respective comparator and capacitive elements (via nodes 740', 740", and 740'''). In addition, each of sensing circuit portions 700', 700", and 700''' includes a respective comparator (e.g., comparators 750', 750", and 750''') having a reference voltage (e.g., reference voltages 7507', 7507", and 7507''') coupled to control logic 770 and the capacitive elements similar to various embodiments of sensing circuit 700 discussed above.

Furthermore, control logic 770 is suitably configured to interpolate the signals output by each of comparators 750', 750", and 750''' to determine positional information about the conductive object relative to the sensor electrodes of sensing circuit portions 700', 700", and 700'''. In other words, by proper processing information about the capacitance ratios obtained from sensing circuits 700', 700", and 700''', control logic 770 is capable of determining positional information such as the location or motion of the conductive object. The processing can be quite simple. For example, system 1200 can determine which sensor electrode a conductive object is most proximately located by determining which of the sensing circuit portions 700', 700", and 700''' had the largest change in capacitance. For example, if the capacitive element having variable capacitance $C_X"$ has a larger change capacitance than the capacitive element having variable capacitance $C_X'$, but the capacitive element having variable capacitance $C_X'''$ has a larger change capacitance than the capacitive element having variable capacitance $C_X"$, control logic 770 of this example will determine that the object is located closer to capacitive element 730''' than to either of capacitive elements 730' and 730". More complex sensor electrode patterns and interpolation algorithms are easily found in literature and patents in the field of capacitance proximity sensing, and are contemplated here.

In one embodiment, reference voltages 7507', 7507", and 7507''' are substantially the same voltage. Reference voltages 7507', 7507", and 7507''' are likely substantially similar if one single microcontroller is used to implement comparators 750', 750", and 750'''. In another embodiment, at least two of reference voltages 7507', 7507", and 7507''' include substantially different voltages. In yet another embodiment, each of reference voltages 7507', 7507", and 7507''' include substantially different voltages. In almost each case, reference voltages 7507', 7507", and 7507''' will have slight differences due to considerations such as manufacturing and design tolerances, and these differences will not be substantial.

In operation, each of sensing circuit portions 700', 700", and 700''' individually functions in a manner similar to the various embodiments of sensing circuit 700 discussed above. Notably, although FIG. 12 illustrates system 1200 including three sensing circuits, various embodiments of system 1200 contemplate that system 1200 may include any number of sensing circuits greater than zero. Accordingly, system 1200 may include an infinite number of configurations.

In another exemplary embodiment of system 1200, system 1200 has only two sensing circuit portions 700' and 700" with fixed capacitances, sensor electrodes, and variable capacitances configured to change in capacitance in response to input near the sensor electrodes. The third circuit portion 700''', although similar to the sensing circuit portions 700' and 700" when represented in circuit diagram form, has only fixed capacitances that are configured to change insubstantially in response to input near the fixed capacitances. The circuit portion 700''' is driven the same way as the sensing portions 700 and 700''' during operation in this embodiment, and functions as a reference for system 1200. The changes associated with circuit portion 700''' can be used to reject noise more reliably. If the capacitances of capacitive elements 720''' and 730''' are large enough to provide low impedance, then the reference could also provide the function of a guard voltage from node 740''' to the other sensing circuitry.

As illustrated, sensing system 1200 includes waveform generator 710, sensing circuit portions 700', 700", and 700''', and control logic 770, wherein each of sensing circuit portions 700', 700", and 700''' are coupled to shared waveform generator 710 and control logic 770 to form circuit portions similar to sensing circuit 700. In alternate embodiments, sensing system 1200 can be adapted to implement sensing circuits, either in a transcapacitive arrangement or an absolute capacitance arrangement, analogous to sensing circuit 800 shown in FIG. 8, sensing circuit 900 shown in FIG. 9, sensing circuit 1000 shown in FIG. 10, and sensing circuit 1100 shown in FIG. 11 to enable alternate multiple-sensor electrode systems.

In one embodiment of system 1200, switches 780', 780", and 780''' may all be closed simultaneously while biasing elements 760', 760", and 760''' are utilized to clear charge from their respective capacitive elements. The voltage driven by waveform generator 710 may also simultaneously drive each of nodes 790', 790", and 790'''. Furthermore, when switches 780', 780", and 780''' are opened, biasing elements 760', 760", and 760''' may be used to short nodes 740', 740", and 740''' to ground while nodes 790', 790", and 790''' are measured with their respective comparators. In an alternate embodiment, one node (e.g., node 740') may be driven at a time while the other nodes (e.g., nodes 740" and 740''') are driven to ground, and each node measured sequentially. In other embodiments, nodes may be measured and grounded in various combinations.

Figure 13:
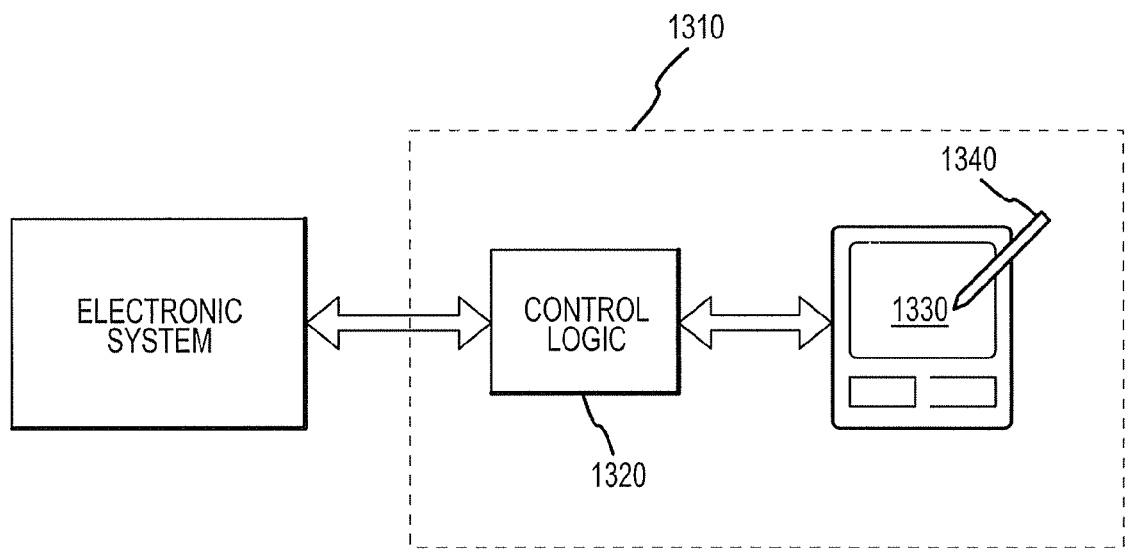
FIG. 13 is a diagram of one embodiment of an electronic system coupled to a proximity sensor device having one or more of the sensing circuits of FIGS. 1-5 and 7-11, and/or one or more of the systems of FIGS. 6 and 12.

As stated above, the devices and systems for measuring a ratio of capacitances are particularly applicable for use in proximity sensor devices. Turning now to FIG. 13, a block diagram is illustrated of an exemplary electronic system 1300 that is coupled to a proximity sensor device 1310. Electronic system 1300 is meant to represent any type of personal computer, portable computer, workstation, personal digital assistant, video game player, communication device (including wireless phones and messaging devices), media device, including recorders and players (including televisions, cable boxes, music players, and video players) or other device capable of accepting input from a user and of processing information. Accordingly, the various embodiments of system 1300 may include any type of processor, memory or display. Additionally, the elements of system 1300 may communicate via a bus, network or other wired or wireless interconnection. The proximity sensor device 1310 can be connected to the system 1300 through any type of interface or connection, including I2C, SPI, PS/2, Universal Serial Bus (USB), Bluetooth, RF, IRDA, or any other type of wired or wireless connection to list several non-limiting examples.

Proximity sensor device 1310 includes control logic implemented on controller 1320 and a sensing region 1330, wherein sensing region 1330 comprises sensing circuit 100, 200, 300, 400, 500, 700, 800, 900, 1000, and/or 1100, and/or system 600 and/or 1200. Proximity sensor device 1310 is sensitive to the position of an input 1340 (which can be provided by one or more fingers, styli, and/or other input objects) in the sensing region 1330, and can detect positional information about the input 1340 by measuring the resulting changes in capacitance due to input 1340. "Sensing region" 1330 as used herein is intended to broadly encompass any space above, around, in and/or near the proximity sensor device 1310 wherein the sensor is able to detect a position of the object, including contact with the sensor electrodes. In a conventional embodiment, sensing region 1330 extends from a surface of the sensor in one or more directions for a distance into space until signal-to-noise ratios prevent input detection. This distance may be on the order of less than a millimeter, millimeters, centimeters, or more, and may vary significantly with the sensor electrode dimensions, sensor design, and/or the sensor performance (e.g. accuracy or resolution) desired. In some embodiments, a dielectric solid (e.g., a plastic sheet) may be adhered to and/or placed over a portion or the entire "sensing region" to control the capacitance response to touch. Accordingly, the planarity and curvature, size, shape and exact locations of the particular sensing regions 1330 will vary widely from embodiment to embodiment.

In exemplary operation, proximity sensor device 1310 suitably detects a position of input 1340 by measuring the variable capacitance(s) associated with the plurality of sensor electrodes which are affected by one or more fingers, styli, and/or other objects within sensing region 1330. And, using controller 1320, proximity sensor device 1310 provides electrical or electronic indicia of the position to the electronic system 1300. The system 1300 appropriately processes the indicia to accept inputs from the user for any appropriate purpose and produces any appropriate responses, as discussed earlier.

The proximity sensor device 1310 can use discrete arrays, or any other arrangement of capacitive sensor electrodes to support any number of sensing regions 1330. The proximity sensor device can also vary in the type of information provided, such as to provide "one-dimensional" position information (e.g. along a sensing region) as a scalar, "two-dimensional" position information (e.g. horizontal/vertical axes, angular/radial, or any other axes that span the two dimensions) as a combination of values, a "two-dimensional" image of the proximity as an array of values, and the like.

The controller 1320, sometimes referred to as a proximity sensor processor or touch sensor controller, generally directs the process used to measure capacitance using any of the various techniques described above. Here, controller 1320 also communicates with the electronic system 1300. The controller 1320 can perform a variety of additional processes to implement the proximity sensor device 1310. For example, the controller 1320 can select or connect individual capacitances, calculate position or motion information based on the values of the capacitances, report a position or motion when a threshold is reached, interpret and wait for a valid tap/stroke/character/button/gesture sequence before reporting it to the electronic system 10 or indicating it to the user, or any of a multitude of different processes.

In this specification, the term "controller" is defined to include one or more processing elements that are adapted to perform the recited operations. Thus, the controller 1320 can comprise all or part of one or more integrated circuits, firmware code, and/or software code.

Again, as the term is used in this application, the term "electronic system" broadly refers to any type of device that communicates with proximity sensor device 1310. The electronic system 1300 could thus comprise any type of device or devices in which a touch sensor device can be implemented in or coupled to. The proximity sensor device 1310 could be implemented as part of the electronic system 1300, or coupled to the electronic system 1300 using any suitable technique. As non-limiting examples the electronic system 1300 could thus comprise any type of computing device, media player, communication device, or another input device (such as another touch sensor device or keypad). In some cases the electronic system 1300 is itself a peripheral to a larger system. For example, the electronic system 1300 could be a data input or output device, such as a remote control or display device, that communicates with a computer or media system (e.g., remote control for television) using a suitable wired or wireless technique. It should also be noted that the various elements (processor, memory, etc.) of the electronic system 1300 could be implemented as part of an overall system, as part of the touch sensor device, or as a combination thereof. Additionally, the electronic system 10 could be a host or a slave to the proximity sensor device 1310.

It should also be noted that the term "proximity sensor device" is intended to encompass not only conventional proximity sensor devices, but also a broad range of equivalent devices that are capable of detecting the position of a one or more fingers, pointers, styli and/or other objects. Such devices may include, without limitation, touch screens, touch pads, touch tablets, biometric authentication devices, handwriting or character recognition devices, and the like. Similarly, the terms "position" or "object position" as used herein are intended to broadly encompass absolute and relative positional information, and also other types of spatial-domain information such as velocity, acceleration, and the like, including measurement of motion in one or more directions. Various forms of positional information may also include time history components, as in the case of gesture recognition and the like. Accordingly, proximity sensor devices can appropriately detect more than the mere presence or absence of an object and may encompass a broad range of equivalents.

It should also be understood that the mechanisms of the present invention are capable of being distributed as a program product in a variety of forms. For example, the mechanisms of the present invention can be implemented and distributed as a proximity sensor program on a computer-readable signal bearing media. Additionally, the embodiments of the present invention apply equally regardless of the particular type of signal bearing media used to carry out the distribution. Examples of signal bearing media include: recordable media such as memory cards, optical and magnetic disks, hard drives, and transmission media such as digital and analog communication links.

Figure 14:
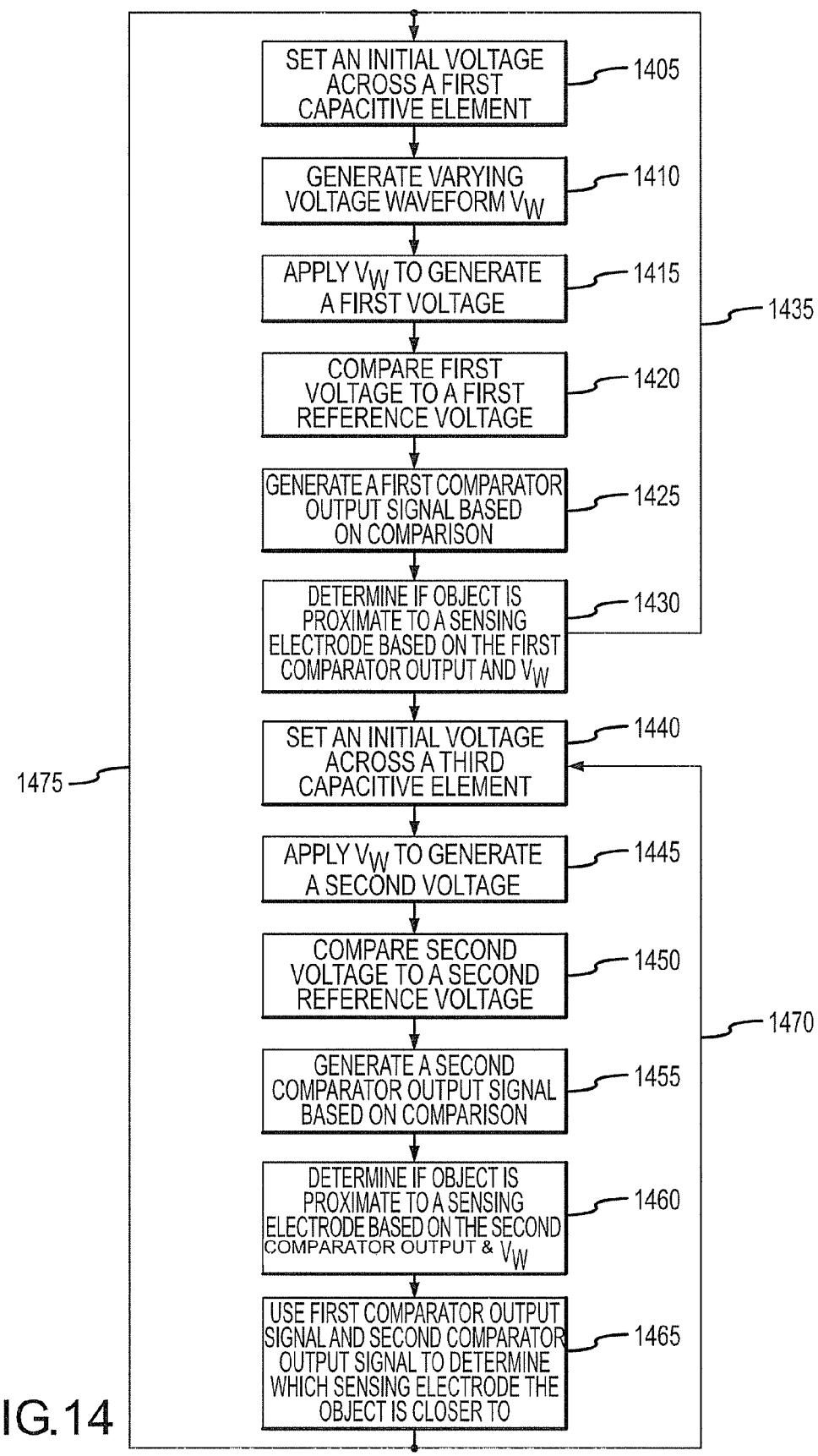
FIG. 14 is a flow diagram representing one embodiment of a method for generating a comparator output signal dependent on at least one ratio including a first capacitance ($C_1$) of a first capacitive element and a second capacitance ($C_2$) of a second capacitive element.

FIG. 14 is a flow diagram representing one embodiment of a method 1400 for generating a first comparator output signal dependent on a ratio including a first capacitance ($C_1$) of a first capacitive element (e.g., capacitive element 120) and a second capacitance ($C_2$) of a second capacitive element (e.g., capacitive element 130). In one embodiment, the ratio comprises $C_1$ divided by ($C_1+C_2$). In another embodiment, the ratio comprises $C_2$ divided by ($C_1+C_2$). In further embodiments, combinations proportional to these capacitance ratios may be measured.

Method 1400, in one embodiment, initiates by setting an initial voltage across capacitive element 120 and/or capacitive element 130 (step 1405). Moreover, method 1400 includes generating a varying voltage waveform ($V_w$) from a waveform generator (e.g., waveform generator 110) (step 1410) and applying $V_w$ to capacitive element 120 and/or capacitive element 130 to generate a first voltage ($V_{n1}$) (step 1415). In one embodiment, step 1410 includes generating $V_w$ with a step or pulse modulated input to a RC filter. In another embodiment, step 1410 includes generating $V_w$ with a digital-to-analog converter. In yet another embodiment, step 1410 includes generating a variable $V_w$ such that $V_w$ follows a predefined voltage ramp. In yet another embodiment, step 1410 includes generating a variable $V_w$ such that $V_w$ is variable dependent on the comparator output signal. In still another embodiment, step 1410 includes generating a substantially continuous varying voltage signal. In still yet another embodiment, step 1410 includes generating a discretely varying voltage signal.

In accordance with one embodiment, step 1415 includes applying $V_w$ such that $V_{n1}$ exhibits values above a reference voltage (e.g., reference voltage 1507') and a change in $V_{n1}$ is substantially proportional to a ratio including $C_1$ and $C_2$. In another embodiment, step 1415 includes applying $V_w$ such that $V_{n1}$ exhibits values below reference voltage 1507' and a change in $V_{n1}$ is substantially proportional to a ratio including $C_1$ and $C_2$. In yet another embodiment, step 1415 includes applying $V_w$ such that $V_{n1}$ exhibits values above and below reference voltage 1507' and a change in $V_{n1}$ is substantially proportional to a ratio including $C_1$ and $C_2$.

Moreover, method 1400 includes comparing $V_{n1}$ to reference voltage 1507' (step 1420) and generating the first comparator output signal (step 1425). In one embodiment, the first comparator output signal changes state in response to $V_{n1}$ crossing from being below reference voltage 1507' to being above reference voltage 1507'. In another embodiment, the first comparator output signal changes state in response to $V_{n1}$ crossing from being above reference voltage 1507' to being below reference voltage 1507'. In still another embodiment, the first comparator output signal changes state in response to both $V_{n1}$ crossing from being below reference voltage 1507' to being above reference voltage 1507' and from being above reference voltage 1507' to being below reference voltage 1507'.

Furthermore, method 1400 includes determining whether an object is proximate to a sensor electrode of the first capacitive element and/or the second capacitive element based on the result of steps 1420 and 1425 (step 1430). This step of determining proximity may depend on a $V_w$ value as well as the comparator output. Moreover, method 1400 includes repeating one or more of steps 1405 through 1430 at least one additional time (step 1435).

In another embodiment, method 1400 includes setting an initial voltage across a third capacitive element including a third capacitance $C_3$ and a fourth capacitive element including a third capacitance $C_4$ (step 1440). Moreover, method 1400 includes applying $V_w$ to the third capacitive element and/or the fourth capacitive element to generate a second voltage ($V_{n2}$) (step 1445).

In accordance with one embodiment, step 1445 includes applying $V_w$ such that $V_{n2}$ exhibits values above a reference voltage (e.g., reference voltage 1507") and a change in $V_{n2}$ is substantially proportional to the ratio including $C_3$ and $C_4$. In another embodiment, step 1445 includes applying $V_w$ such that $V_{n2}$ exhibits values below reference voltage 1507" and a change in $V_{n2}$ is substantially proportional to the ratio including $C_3$ and $C_4$. In yet another embodiment, step 1445 includes applying $V_w$ such that $V_{n2}$ exhibits values above and below reference voltage 1507" and a change in $V_{n2}$ is substantially proportional to the ratio including $C_3$ and $C_4$.

Moreover, method 1400 includes comparing $V_{n2}$ to reference voltage 1507" (step 1450) and generating the second comparator output signal (step 1455). In one embodiment, the second comparator output signal changes state in response to $V_{n2}$ crossing from being below reference voltage 1507" to being above reference voltage 1507", and a change in $V_w$ is representative of a second ratio including the third capacitance and the fourth capacitance when $V_{n2}$ is substantially equal to reference voltage 1507". In another embodiment, the second comparator output signal changes state in response to $V_{n2}$ crossing from being above reference voltage 1507" to being below reference voltage 1507", and a change in $V_w$ is representative of a second ratio including the third capacitance and the fourth capacitance when $V_{n2}$ is substantially equal to reference voltage 1507". In still another embodiment, the second comparator output signal changes state in response to both $V_{n2}$ crossing from being below reference voltage 1507" to being above reference voltage 1507" and from being above reference voltage 1507" to being below reference voltage 1507", and a change in $V_w$ is representative of a second ratio including the third capacitance and the fourth capacitance when $V_{n2}$ is substantially equal to reference voltage 1507".

Furthermore, method 1400 includes determining whether an object is proximate to a sensor electrode of the third capacitive element and/or the fourth capacitive element based on the result of steps 1450 and 1455 (step 1460). In addition, method 1400 includes using the first comparator output signal and the second comparator output signal to determine which sensor electrode the object is closer to (step 1465). Step 1465, in one embodiment, includes utilizing interpolation techniques to increase the resolution/granularity of the position or the object with respect to the electrodes. In another embodiment, step 1465 includes determining which electrode has a greater change in capacitance in determining which sensor electrode the object is closer to.

Furthermore, method 1400 includes repeating one or more of steps 1440 through 1465 at least one additional time (step 1470). Moreover, method 1400 includes repeating one or more of steps 1405 through 1465 at least one additional time (step 1475).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

We claim:

1. An input device for receiving user input, the input device comprising:
    a first comparator including a first comparator input, a first comparator output, and a first reference voltage;
    a first capacitive element including a first capacitance, a first electrode coupled to the first comparator input, and a second electrode;
    a first biasing element coupled to the first electrode of the first capacitive element;
    a digitally-controlled voltage waveform generator for generating a varying waveform, the voltage waveform generator including a voltage waveform generator output coupled to the second electrode of the first capacitive element;

a second capacitive element including a second capacitance and a third electrode coupled to the first comparator input such that a first output signal of the first comparator is dependent on a ratio of capacitances comprising the first capacitance and the second capacitance; and a controller coupled to the first comparator output, the controller programmed to control the digitally-controlled voltage waveform generator such that the varying waveform is controllably varied with a searching algorithm to cause a voltage at the first comparator input to be near the first reference voltage, and such that the varying waveform more quickly causes the voltage at the first comparator input to repeatedly cross the first reference voltage and trip the first comparator output, and wherein the controller is further configured to determine a measure of the ratio of capacitances from when the first comparator output tripped, and generate position information for objects in a sensing region from the measure of the ratio of capacitances, wherein:

at least one of the first capacitive element and the second capacitive element is a variable capacitive element.

2. The input device of claim 1, wherein the first electrode and the second electrode each comprise sensor electrodes configured to couple capacitively with each other to produce the first capacitance, and wherein when a conductive object is moved proximate to the sensor electrodes the first capacitance changes.

3. The input device of claim 1, wherein the third electrode comprises a sensor electrode configured to couple capacitively with an external object to change the second capacitance, and wherein when the external object is moved proximate to the sensor electrodes the second capacitance changes.

4. The input device of claim 1, further comprising:
a second comparator including a second comparator input, a second comparator output, and a second reference voltage;
a third capacitive element including a third capacitance, a fifth electrode coupled to the second comparator input, and a sixth electrode;
a second biasing element coupled to the fifth electrode of the third capacitive element; and
a fourth capacitive element including a fourth capacitance and a seventh electrode coupled to the second comparator input, wherein:
the digitally-controlled voltage waveform generator output is coupled to the sixth electrode of the third capacitive element, and
a second output signal of the comparator is dependent on a second ratio comprising the third capacitance and the fourth capacitance.

5. The input device of claim 4, wherein at least one of the first capacitive element, the second capacitive element, the third capacitive element, and the fourth capacitive element is a variable capacitive element.

6. The input device of claim 1, wherein the first capacitive element and the second capacitive element are both variable capacitive elements.

7. The input device of claim 1, wherein the comparator is implemented utilizing a digital input and the reference voltage is a threshold voltage of the digital input.

8. The input device of claim 1, wherein the digitally-controlled voltage waveform generator comprises a digital-to-analog converter.

9. The input device of claim 1, wherein the digitally-controlled voltage waveform generator comprises a resistor-capacitor filter sensing circuit.

10. The input device of claim 9, wherein the digitally-controlled voltage waveform generator further comprises a pulse modulated signal generator coupled to the resistor-capacitor filter sensing circuit, wherein the pulse modulated signal generator is configured to drive one of a pulse code modulated signal and a pulse width modulated signal into the resistor-capacitor filter sensing circuit.

11. The input device of claim 1, wherein the digitally-controlled voltage waveform generator comprises a switched capacitor sensing circuit.

12. The input device of claim 1, wherein the first biasing element comprises a first switch.

13. The input device of claim 1, further comprising:
a guarding electrode disposed proximate to the first capacitive element and the second capacitive element.

14. The input device of claim 1, wherein the comparator, the first biasing element, and the controller form at least a portion of a microcontroller.

15. The input device of claim 14, wherein the microcontroller comprises at least one digital I/O having a digital input and a digital output, wherein the comparator is implemented utilizing the digital input and the first biasing element is implemented utilizing the digital output.

16. The input device of claim 1, wherein the digitally-controlled voltage waveform generator forms at least a portion of a microcontroller.

17. An input device for receiving user input, the input device comprising:
a first comparator including a first comparator input, a first comparator output, and a first reference voltage;
a first capacitive element including a first capacitance, a first electrode, and a second electrode;
a first node coupling the first comparator input to the second electrode;
a digitally-controlled voltage waveform generator for generating a varying waveform, the digitally-controlled voltage waveform generator including a digitally controlled voltage waveform generator output;
a first switch configured to selectively couple the digitally-controlled voltage waveform generator output to the first node;
a first biasing element coupled to the first electrode;
a second capacitive element including a second capacitance and a third electrode coupled to the first electrode such that a first output signal of the first comparator is dependent on a ratio of capacitances comprising the first capacitance and the second capacitance; and
a controller coupled to the first comparator output, the controller programmed to control the digitally-controlled voltage waveform generator such that the varying waveform is controllably varied with a searching algorithm to cause a voltage at the first comparator input to be near the first reference voltage, and such that the varying waveform more quickly causes the voltage at the first comparator input to repeatedly cross the first reference voltage and trip the first comparator output, and wherein the controller is further configured to determine a measure of the ratio of capacitances from when the first comparator output tripped and generate position information for objects in a sensing region from the measure of the ratio of capacitances, wherein:
at least one of the first capacitive element and the second capacitive element is a variable capacitive element.

18. The input device of claim 17, further comprising:
a second comparator including a second comparator input, a second comparator output, and a second reference voltage;

a third capacitive element including a third capacitance, a fifth electrode, and a sixth electrode;

a second node coupling the second comparator input to the sixth electrode;

a second switch configured to selectively couple the digitally-controlled voltage waveform generator output to the second node;

a second biasing element coupled to the fifth electrode; and a fourth capacitive element including a fourth capacitance and a seventh electrode coupled to the fifth electrode, wherein:

the controller is coupled to the second comparator output, and a second output signal of the second comparator is dependent on a second ratio comprising the third capacitance and the fourth capacitance.

19. The input device of claim 18, further comprising a multiplexer comprising the first switch and the second switch.

20. The input device of claim 17, wherein the first capacitive element and the second capacitive element are both variable capacitive elements.

21. The input device of claim 17, wherein the digitally-controlled voltage waveform generator comprises a digital-to-analog converter.

22. The input device of claim 17, wherein the first comparator and the first biasing element form at least a portion of a microcontroller comprising at least one digital I/O including a digital input and a digital output, wherein the first comparator is implemented utilizing the digital input and the first biasing element comprises a second switch implemented utilizing the digital output.

23. A method for providing a user input to an electronic device in response to an object in a sensing region, the method generating a first comparator output signal dependent on a ratio including a first capacitance ($C_1$) of a first capacitive element and a second capacitance ($C_2$) of a second capacitive element, the method comprising the steps of:

setting an initial voltage across the first capacitive element;

generating a varying voltage waveform ($V_w$);

applying $V_w$ to at least one of the first capacitive element and the second capacitive element to generate a first voltage ($V_{n1}$) such that $V_{n1}$ exhibits values above and below a first reference voltage ($V_{ref1}$) at different times, wherein a change in $V_{n1}$ is substantially proportional to the ratio including the first capacitance and the second capacitance, and wherein $V_w$ is controllably varied with a searching algorithm to cause $V_{n1}$ to be near and more quickly cross $V_{ref1}$;

comparing $V_{n1}$ to $V_{ref1}$;

generating the first comparator output signal, wherein the first comparator output signal changes state in response to $V_{n1}$ crossing from one of being below $V_{ref1}$ to being above $V_{ref1}$ and from being above $V_{ref1}$ to being below $V_{ref1}$, and wherein a change in $V_w$ is representative of a first ratio including the first capacitance and the second capacitance when $V_{n1}$ is substantially equal to $V_{ref1}$;

determining when the first comparator output signal changes state;

determining a measure of the ratio from when the first comparator output signal changes state; and generating an indicia of object position in the sensing region to facilitate user input using the measure of the ratio.

24. The method of claim 23, wherein the first ratio comprises one of $C_1$ divided by $(C_1+C_2)$ and $C_2$ divided by $(C_1+C_2)$.

25. The method of claim 23, wherein the generating $V_w$ step comprises the step of generating $V_w$ with a predefined voltage ramp.

26. The method of claim 23, wherein the generating $V_w$ step comprises the step of generating $V_w$ with a digital-to-analog converter.

27. The method of claim 23, wherein the generating $V_w$ step is variable dependent on the comparator output signal.

28. The method of claim 23, further comprising the steps of:

generating a second comparator output signal dependent on a second ratio including a third capacitance of a third capacitive element and a fourth capacitance of a fourth capacitive element;

setting an initial voltage across the third capacitive element;

applying $V_w$ to at least one of the third capacitive element and the fourth capacitive element to generate a second voltage ($V_{n2}$) such that $V_{n2}$ exhibits values above and below a second reference voltage ($V_{ref2}$) at different times, wherein a change in $V_{n2}$ is substantially proportional to the second ratio including the third capacitance and the fourth capacitance;

comparing $V_{n2}$ to $V_{ref2}$; and generating the second comparator output signal, wherein the second comparator output signal changes state in response to $V_{n2}$ crossing from one of being below $V_{ref2}$ to being above $V_{ref2}$ and from being above $V_{ref2}$ to being below $V_{ref2}$, and wherein a change in $V_w$ is representative of a second ratio including the second capacitance and the third capacitance when $V_{n2}$ is substantially equal to $V_{ref2}$.

29. The method of claim 23, further comprising the step of repeating the applying $V_w$ step, the comparing $V_{n1}$ step, and the generating the first comparator output signal step at least one additional time.

30. The method of claim 23, wherein the generating $V_w$ step comprises the step of generating a continuously varying voltage signal.

31. The method of claim 23, wherein the generating $V_w$ step comprises the step of generating a discretely varying voltage signal.

* * * * *